United States Patent
Miyazawa

(10) Patent No.: US 7,025,647 B2
(45) Date of Patent: Apr. 11, 2006

(54) METHOD FOR MANUFACTURING LAMINATED FILM, ELECTRO-OPTICAL DEVICE, METHOD FOR MANUFACTURING ELECTRO-OPTICAL DEVICE, ORGANIC ELECTROLUMINESCENCE DEVICE, AND ELECTRONIC APPLIANCES

(75) Inventor: Takashi Miyazawa, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 7 days.

(21) Appl. No.: 10/283,304

(22) Filed: Oct. 30, 2002

(65) Prior Publication Data

US 2003/0127974 A1  Jul. 10, 2003

(30) Foreign Application Priority Data

Oct. 30, 2001  (JP) .............................. 2001-332919

(51) Int. Cl.
*H01J 9/00* (2006.01)

(52) U.S. Cl. ........................................ 445/24; 313/504

(58) Field of Classification Search .................. 427/66, 427/377; 313/504, 506, 511, 512; 445/24, 445/58; 428/446, 698, 448
See application file for complete search history.

(56) References Cited

U.S. PATENT DOCUMENTS

| | | | |
|---|---|---|---|
| 4,870,322 A * | 9/1989 | Matsudaira et al. ........ 313/506 |
| 5,081,163 A | 1/1992 | Pekala | |
| 5,086,085 A | 2/1992 | Pekala | |
| 5,306,555 A | 4/1994 | Ramamurthi et al. | |
| 5,470,802 A * | 11/1995 | Gnade et al. ............... 438/781 |
| 5,482,564 A | 1/1996 | Douglas et al. | |
| 5,569,058 A * | 10/1996 | Gnade et al. .................. 445/24 |
| 5,612,549 A * | 3/1997 | Nelson et al. ................ 257/88 |
| 5,872,355 A * | 2/1999 | Hueschen ................ 250/208.1 |
| 5,876,865 A * | 3/1999 | Hsieh ......................... 428/690 |
| 5,973,015 A | 10/1999 | Coronado et al. | |
| 6,024,801 A | 2/2000 | Wallace et al. | |
| 6,075,316 A * | 6/2000 | Shi et al. ..................... 313/504 |
| 6,077,876 A | 6/2000 | Mendenhall et al. | |
| 6,154,595 A * | 11/2000 | Yokogawa et al. ......... 385/127 |
| 6,197,270 B1 | 3/2001 | Sonoda et al. | |
| 6,635,989 B1 | 10/2003 | Nilsson et al. | |
| 6,762,553 B1 * | 7/2004 | Yokogawa et al. ......... 313/509 |

FOREIGN PATENT DOCUMENTS

| | | |
|---|---|---|
| CN | 1296295 | 5/2001 |
| CN | 1311976 | 9/2001 |
| EP | 1 100 129 A2 | 5/2001 |
| EP | 1153739 A1 * | 11/2001 |

(Continued)

OTHER PUBLICATIONS

Thomas, Ian M., "Porous fluoride antireflective coatings", *Applied Optics*, vol. 27, No. 16, Aug. 15, 1988, pp. 3356-3358.

*Primary Examiner*—Joseph Williams
(74) *Attorney, Agent, or Firm*—Oliff & Berridge, PLC

(57) ABSTRACT

The invention provides a method for manufacturing an electro-optical device that is able to maintain the chemical and physical properties of the material layer in desired conditions. The organic electroluminescence display includes a plurality of layers including a low refractivity layer, a seal layer, a positive electrode, a luminous layer, a positive hole transfer layer and a negative electrode laminated on a substrate. The wet gel is dried by the supercritical drying method after being applied on the substrate in forming the low refractivity layer of the laminated layers.

29 Claims, 22 Drawing Sheets

FOREIGN PATENT DOCUMENTS

| | | |
|---|---|---|
| JP | 53-112732 | 10/1978 |
| JP | A-57-9051 | 1/1982 |
| JP | A-57-51781 | 3/1982 |
| JP | A-59-194393 | 11/1984 |
| JP | A-63-70257 | 3/1988 |
| JP | A-63-175860 | 7/1988 |
| JP | A-2-135359 | 5/1990 |
| JP | A-2-135361 | 5/1990 |
| JP | A-2-209988 | 8/1990 |
| JP | A-3-37992 | 2/1991 |
| JP | A-3-152184 | 6/1991 |
| JP | A-2001-110711 | 4/2001 |
| KR | 2001-0060297 | 7/2001 |
| WO | WO 200134382 A1 * | 5/2001 |

* cited by examiner (a)

(b)

(c)

(d)

(e)

(a)

(b)

METHOD FOR MANUFACTURING LAMINATED FILM, ELECTRO-OPTICAL DEVICE, METHOD FOR MANUFACTURING ELECTRO-OPTICAL DEVICE, ORGANIC ELECTROLUMINESCENCE DEVICE, AND ELECTRONIC APPLIANCES

BACKGROUND OF THE INVENTION

1. Field of the Invention

The present invention relates to a method for manufacturing a film that includes a plurality of layers, a method for manufacturing an electro-optical device including an electro-optical element that includes an optical material, and an electronic appliance incorporating the same.

2. Description of the Related Art

An electroluminescence display (electro-optical device) including an organic electroluminescence element corresponding to each pixel is excellent in display performance due to its highly luminous spontaneous light emission, capability of addressing by low current density and voltage, high speed response and emission by a solid organic layer. This display may be advantageous over a liquid crystal display since it can be made to be thin and lightweight and operates with low power consumption.

FIG. 22 is a schematic cross-sectional view showing one example of a related art organic electroluminescence display. In this organic electroluminescence display 100, an organic electroluminescence element 106 having a luminous layer 102 and positive hole transfer layer 103 interposed between a metal electrode (negative electrode) 104 and transparent electrode (positive electrode) 105 is formed on a glass substrate 101. In the case of an active matrix type organic electroluminescence display (not shown), a plurality of data lines and a plurality of scanning lines are disposed as a matrix, and driving transistors, such as a switching transistor and a driving transistor, and the organic electroluminescence element 106 are disposed for each pixel disposed as a matrix divided by the data lines and scanning lines. An electric current flows between the negative and positive electrodes by supplying an addressing signal through the data lines and scanning lines, and the organic electroluminescence element 106 emits light to project out the light to the outer surface side of the glass substrate 101, thereby lightening the pixel.

SUMMARY OF THE INVENTION

However, a seal layer and resin layer (or polymer layer) may be disposed in addition to the plural layers as described above in an electroluminescence display that is for practical use. The solvent remaining in the material layer, and impurities, such as monomers and precursors of the polymer generated in the manufacturing steps of the material layer, may cause deterioration of the organic electroluminescence element. In addition, the volume of the material layer decreases by removing the solvent, polymer precursor and monomer which often negatively affects the operation of the organic electroluminescence display.

The present invention addresses the above, and provides a method for manufacturing a laminated film that can maintain chemical and physical characteristics of each layer and each member in desired conditions, a method for manufacturing an electro-optical device, and an electronic appliance that includes the electro-optical device manufactured by the method above, by sufficiently eliminating the impurities in manufacturing each member and laminated film in the electro-optical device.

The present invention provides a method for manufacturing a laminated film that includes a plurality of layers. At least a part of the manufacturing at least one layer of a plurality of layers is performed under a supercritical condition.

According to the present invention, solvents and impurities can be removed from the layer by performing at least a part of the manufacturing a layer constituting the laminated film under a supercritical condition. Consequently, the laminated film is prevented or substantially prevented from being deteriorated by the impurities.

The term "layer" as used herein is not restricted to a layer of stacked layers, and includes the materials and members formed in a region distributed in a direction perpendicular to the lamination direction.

Since a supercritical condition with a relatively low temperature and low pressure may be realized by using, for example, carbon dioxide ($CO_2$) and ethyl alcohol as a supercritical fluid, the impurities (solvent, impurity and the like) can be removed from the layer while suppressing chemical changes and physical changes (for example change of the shape such as volume contraction) of the layer. Accordingly, a laminated film having desired characteristics can be obtained.

The "supercritical fluid" means a fluid that falls in a region of a phase diagram in which the temperature and pressure are a little higher than the critical point on the temperature, pressure and entropy lines. The medium available for the supercritical fluid include water, carbon dioxide, methyl alcohol, ethyl alcohol and oxygen.

The at least one layer above includes a low refractivity material. Examples of the low refractivity material include porous silica, magnesium fluoride or materials containing the same, a gel prepared by dispersing magnesium fluoride fine particles, fluorinated polymer or materials containing the same, porous polymers comprising branched structures, and a prescribed material containing at least one of either inorganic fine particles or organic fine particles.

When a wet gel is used for the low refractivity material, a light permeable and porous aerogel may be obtained by drying the wet gel under a supercritical condition. The wet gel can be dried under a supercritical condition with substantially little contraction to form porous aerogel.

At least one layer of the layers above includes a polymer. The forming the layer including the polymer includes disposing a precursor or monomer of the polymer on a substrate followed by curing or polymerizing.

The polymer layer as one layer of the laminated film may be formed by coating a monomer having high fluidity on the substrate followed by curing or polymerization. The solvent remaining in the polymer layer, and polymer precursor or monomer may be removed by drying the polymer layer formed by curing or polymerization under a supercritical condition. When the polymer layer is porous, the void ratio may be maintained by drying under a supercritical condition.

At least one layer of the plural layers is a barrier layer. Permeability of substances may be reduced or suppressed by providing the barrier layer.

The polymer layer may be formed by curing or polymerization after coating the monomer having high fluidity, in order to reduce a defective structure of the barrier layer when the polymer layer (or a layer of a low refractive index material) is formed on or under the barrier layer. Since the void ratio of the polymer layer is maintained by drying the polymer layer (the low refractivity layer) under a supercritical condition, the laminated film including the barrier layer and polymer layer may have good light transmittance with good barrier property.

The barrier layer may be appropriately selected depending on the substance to be prevented or substantially prevented from being permeated. For example, ceramics, particularly silicon nitride, silicone oxide nitride and silicon oxide are preferably to reduce or suppress oxygen and water from permeating. The barrier layer may include a layer prepared by dispersing at least one of the drying agent and adsorbent in an inorganic material. An insulation layer supplemented with various elements may be preferably used to reduce or suppress metal ions form permeating.

The electro-optical device according to the present invention includes the laminated film manufactured by the method for manufacturing the laminated film and an electro-optical element.

The present invention provides a first method for manufacturing an electro-optical device including an electro-optical element that includes an optical material. At least a part of the forming at least one member of the members including the electro-optical device is performed under a supercritical condition.

The present invention also provides a second method for manufacturing an electro-optical device including an electro-optical element including an optical material. The method includes forming at least one of a polymer layer and low refractivity layer, at least a part of which being performed under a supercritical condition.

The "low refractivity" layer as used herein is referred to as a material layer having a refractive index equal to or lower than the refractive index of a related art glass. The refractive index is preferably 1.5 or less, more preferably 1.2 or less.

According to the present invention, the solvent and impurities contained in the member may be eliminated or substantially eliminated from the member by performing a part of the forming the member constituting the electro-optical device under a supercritical condition. Accordingly, the impurities causing deterioration of the element may be sufficiently removed from the electro-optical device, enabling the desired performance of the electro-optical device to be maintained for a long period of time. The desired shape of the member may be maintained by removing the solvent and impurities under a supercritical condition.

The term "forming" above include physical phenomena to remove the solvent and monomer as well as various chemical phenomena.

The method for manufacturing the electro-optical device may include forming a barrier layer. Substances that cause deterioration of the element, such as oxygen, moisture and ions, may be prevented or substantially prevented from invading into the device by providing the barrier layer.

The present invention provides a method for manufacturing an organic electroluminescence device including an organic electroluminescence element. At least a part of the forming at least one member of the members constituting the organic luminescence device is performed under a supercritical condition.

The present invention provides a method for manufacturing an organic electroluminescence device including an organic electroluminescence element. At least a part of the forming at least one material layer of the material layers constituting the organic luminescence element is performed under a supercritical condition. Examples of the material layer constituting the organic electroluminescence element include a positive hole injection layer, a positive hole transfer layer, a luminous layer, an electron transfer layer and an electron injection layer.

A first electronic appliance according to the present invention includes the electro-optical device as described above.

A second electronic appliance according to the present invention includes the electro-optical device manufactured by the method for manufacturing the electro-optical device described above.

A third electronic appliance according to the present invention includes the organic electroluminescence device manufactured by the method for manufacturing the electroluminescence device as described above.

The present invention provides an electronic appliance that is excellent in image qualities while having a bright display screen.

BRIEF DESCRIPTION OF THE DRAWINGS

FIG. 18(a) is a plan view and FIG. 18(b) is a cross-sectional view taken along plane B—B of FIG. 18(a).

DETAILED DESCRIPTION OF PREFERRED EMBODIMENTS

Figure 1:
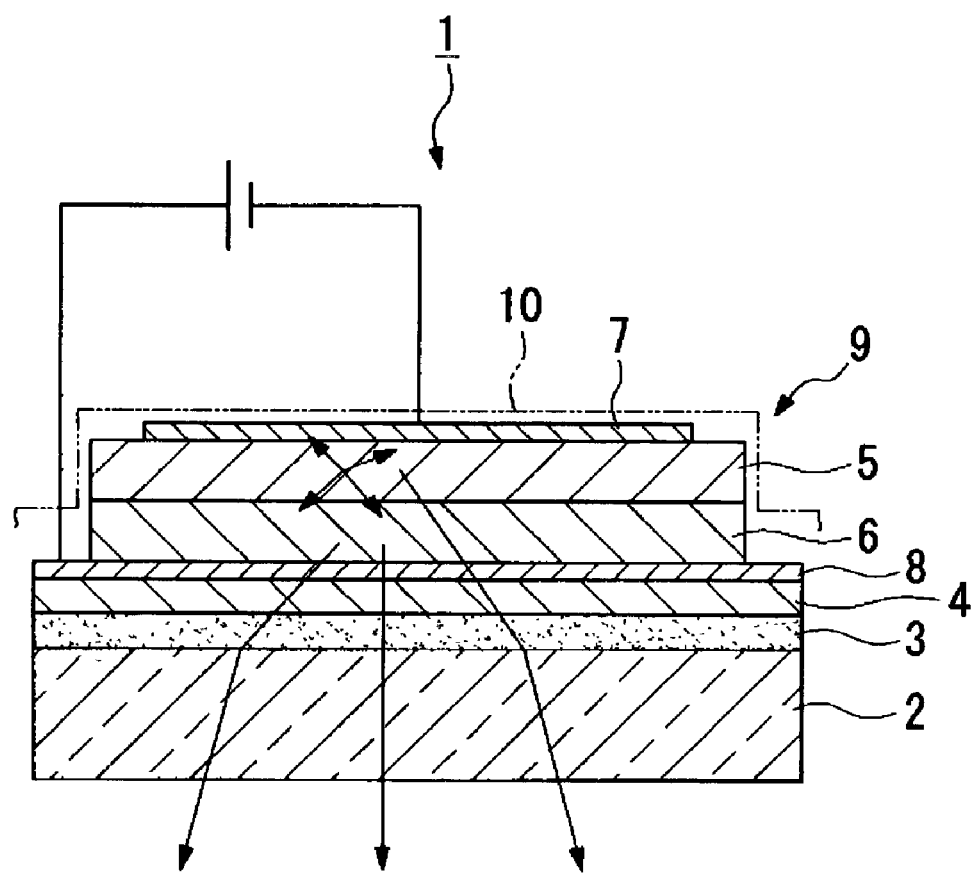
FIG. 1 is a schematic showing one example of the layer structure of the electro-optical device formed by the method for manufacturing the electro-optical device according to the present invention.

The method for manufacturing the electro-optical device according to the present invention is described hereinafter. An example of the electro-optical device manufactured by the manufacturing method according to the present invention is described at first with reference to FIG. 1. FIG. 1 is a schematic cross-sectional view of the structure showing one example of an organic electroluminescence display as the electro-optical device manufactured by the manufacturing method according to the present invention. However, FIG. 1 shows only an example of the organic electroluminescence display, and the present invention is not restricted thereto.

The organic electroluminescence display 1 shown in FIG. 1 includes a light permeable substrate (light transmission layer) 1; an electroluminescence element (luminous element) 9 including a luminous layer 5 including an organic electroluminescence material interposed between a pair of electrodes (a negative electrode 7 and a positive electrode 8) provided at one surface side of the substrate 2; and a low refractivity layer 3 and a seal layer (or barrier layer) 4 laminated between the substrate 2 and the electroluminescence element 9. The low refractivity layer 3 is provided closer to the substrate 2 than the seal layer 4. The disposition of the negative electrode and positive electrode may be reversed, and the seal layer may be disposed closer to the substrate 2 than the low refractivity layer 3. Otherwise, the seal layer may be provided under the substrate 2.

The emitted light from the luminous layer 5 is projected out from the substrate 2 side in the organic electroluminescence device 1 shown in FIG. 1. Examples of the material to form the substrate 2 include transparent or semi-transparent material that can permeate a light, for example transparent glass, quartz crystal and sapphire, or transparent synthetic resins, such as polyester, polyacrylate, polycarbonate and polyether ketone. Particularly, an inexpensive soda glass is favorably used as the material for the substrate 2.

The substrate may be opaque when the emitted light is projected from the opposed side to the substrate 2, where ceramics, such as alumina, surface insulated sheets prepared by forming an oxide layer on a metal sheet, such as a stainless steel sheet, thermosetting resins and thermoplastic resins, may be used.

The positive electrode 8 is a transparent electrode made of indium tin oxide (ITO) that permeates light. The positive hole transfer layer 6 includes, for example, a triphenylamine derivative (TPD), pyrazolin derivative, stilbene derivative and triphenyldiamine derivative. While examples of the above are described in Japanese Unexamined Patent Application Publication Nos. 63-70257, 63-175860, 2-135359, 2-135361, 2-209988, 3-37992 and 3-152184, the triphenyldiamine derivative is preferable, and 4,4'-bis(N-(3-methylphenyl)-N-phenylamino)biphenyl is suitable. A polymer material, such as polyethylene dioxythiophene or a mixture of polyethylene dioxythiophene and polystyrene sulfonic acid, is also available.

A positive hole injection layer may be formed in place of a positive hole transfer layer, or both the positive hole injection layer and positive hole transfer layer may be formed. While the examples of the material for forming the positive hole injection layer include copper phthalocyanine (CuPc), polyphenylene vinylene, such as polytetrahydrothiophenyl phenylene, 1,1-bis-(4-N,N-ditolylaminophenyl)cyclohexane and tris(8-hydroxyquinolinol) aluminum, copper phthalocyanine (CuPc), is preferably used.

A low molecular weight organic luminous pigment or luminous polymer, or various luminous substances, such as fluorescent substances and luminescence substances, and organic electroluminescence materials such as $Alq_3$ (aluminum chelate complex), are available for the material to form the luminous layer 5. Compounds containing arylene vinylene or polyfluorene structures are preferable among conjugated polymers as the luminous substance. The low molecular weight luminous substances available include naphthalene derivatives, anthracene derivative, perylene derivatives, polymethine and pigments such as polymethine, xanthene, coumarin and cyanine pigments; 8-hydroxyquinoline and metal complexes of their derivatives; aromatic amines; and tetraphenyl cyclopentadiene; and those described in Japanese Unexamined Patent Application Publication Nos. 57-51781 and 59-194393. The negative electrode 7 is a metal electrode including aluminum (Al), magnesium (Mg), gold (Au) and silver (Ag). A laminate of these metals may be also used as the negative electrode.

An electron transfer layer or electron injection layer may be provided between the negative electrode 7 and the luminous layer 5. The materials to form the electron transfer layer are not particularly restricted, and examples of them include metal complexes of oxadiazole derivatives, anthraquinone dimethane and its derivatives, benzoquinone and its derivatives, naphthoquinone and its derivatives, anthraquinone and its derivatives, tetracyanoanthraquinone and its derivatives, fluorenone derivatives, diphenyldicyano ethylene and its derivatives, diphenoquinone derivatives, and 8-hydroxyquinoline and its derivatives. The above are described, as in the case of the materials to form the positive hole transfer layer, in Japanese Unexamined Patent Application Publication Nos. 63-70257, 63-175860, 2-135359, 2-135361, 2-209988, 3-37992 and 3-152184, and 2-(4-biphenylyl)-5-(4-t-butylphenyl)-1,3,4-oxadiazole, benzoquinone, anthraquinone and tris(8-quinolinol)aluminum are particularly suitable.

The low refractivity layer 3 is a layer having a low refractivity than the substrate 2, and the layer includes, for example, silica aerogel. Silica aerogel is a light permeable porous material having a uniform super-fine structure obtained by supercritical drying of a wet gel formed by a sol-gel reaction of silicon alkoxide. Voids account for 90% or more of the volume of the silica aerosol with a balance of fine $SiO_2$ particles. Silica aerosol is a light permeable substance due to its particle diameter smaller than light wavelength, and its refractivity is typically 1.2 or less. The refractivity may be adjusted by changing the void ratio. Glass and quartz crystal as the materials of the substrate 2 has refractivity of 1.54 or more and 1.45 or more, respectively.

The seal layer (or barrier layer) 4 serves to block oxygen and water from invading into the organic electroluminescence element 9 including the electrodes 7 and 8 from the outside of the substrate 2 side, and is able to permeate light by properly selecting the thickness and material of the layer. Ceramics, such as silicon nitride, silicon oxide nitride and silicon oxide, are used as the material constituting the seal layer 4, and silicon oxide nitride is preferable among them considering transparency and gas barrier property. While permeation of metal ions may cause deterioration of the element, an insulation layer containing at least one element selected from the elements, such as boron, carbon, nitrogen, aluminum, silicon, phosphorous, cerium, ytterbium, samarium, erbium, yttrium, lanthanum, gadolinium, dysprosium and neodymium, functions as a barrier layer to block metal ions from permeating. In addition, material layers containing, for example, magnesium oxide, magnesium carbonate, iron oxide, titanium oxide, bentonite, acid clay, montmorillonite, diatomite, active alumina, silica alumina, zeolite, silica, zirconia or barium oxide function as the barrier layer 4 since they adsorb or occlude oxygen and moisture. The thickness of the barrier layer 4 is preferably determined to be smaller than the wavelength of the light emitted from the luminous layer 5 (for example, 0.1 μm).

A plurality of data lines and a plurality of scanning lines are disposed as a lattice, although it is not shown in FIG. 1, when the organic electroluminescence display 1 is an active matrix type display. The organic electroluminescence element 9 is connected to each pixel divided by these data lines and scanning lines via an addressing transistor, such as a switching transistor and a driving transistor. An electric current flows between the electrodes when an addressing signal is supplied through the data lines and scanning lines, and a light is projected out of the outer surface side when the luminous layer 5 of the organic electroluminescence element 9 emits light.

A seal member 10 to block oxygen and water from invading into the electroluminescence element 9 including the electrodes 7 and 8 is also formed on the surface opposed to the seal layer 4 interposing the organic electroluminescence element 9 of the organic electroluminescence display 1. The same material as used above may be used for the seal member.

The process to form the aerogel as a material to constitute the low refractivity layer 3 is described hereinafter.

The procedure to form the aerogel (silica aerogel) is described at first. For forming the aerogel, a mixed solution of metal alkoxide (silicon alkoxide) as a starting material and an organic solvent is prepared, and a wet gel is obtained by hydrolysis and condensation polymerization of metal alkoxide. Then, a silica aerogel layer 3 before drying is formed by sufficiently aging the wet gel in the solvent. Related art methods to form the silica aerogel use tetramethoxy silane (TMOS) or tetraethoxy silane (TEOS) as a starting material, an alcohol, such as methanol and ethanol as a solvent, and aqueous ammonia as a hydrolysis catalyst. The wet gel is applied on the substrate (base) 2 by spin coating or dip coating to form a thin layer of the silica aerogel.

The wet gel (silica aerogel layer 3) formed as described above is dried by supercritical drying.

The wet gel is dried at a high temperature and high pressure above the critical point of the solvent in the supercritical drying method, and a supercritical condition in which the solvent is not distinguished as a gas or liquid is obtained at a high temperature and high pressure above the critical point. Since no gas-liquid interface is formed by eliminating the solvent in the wet gel in the supercritical condition, no mechanical stress arising from surface tension is applied on the sol framework, enabling the wet gel to be dried without substantial contraction.

The solvent in the wet gel (a solution of the starting material) is substituted with the supercritical fluid by the supercritical method using the supercritical fluid, and the solvent in the wet gel is removed. Carbon dioxide ($CO_2$), methanol and ethanol may be used to form the supercritical fluid.

Other media available for the supercritical fluid to supercritical dry include $NH_3$, $H_2O$, $N_2O$, methane, ethane, ethylene, propane, pentane, isopropanol, isobutanol, cyclotrifluoromethane, monofluoromethane and cyclohexanol.

The supercritical drying methods to form the aerogel include an "alcohol dry method" to dry after putting a solvent (usually an alcohol) into a supercritical state, and a "$CO_2$ extraction method" to pour a fluid (supercritical fluid: usually liquefied carbon dioxide) to remove the solvent by allowing it to dissolve in the supercritical fluid.

The alcohol drying method of the two methods is advantageous in that control of the pressure and temperature is simple and the process becomes easy since the solvent is a single phase of an alcohol. The alcohol is heated and compressed at a supercritical state of the alcohol in the alcohol drying method. For example, while the supercritical point of ethanol is 241° C. in the temperature and 6.1 MPa in the pressure, a temperature of 260° C. and a pressure of 8.0 MPa are usually used as a condition above the supercritical state. A temperature of about 80° C. and a pressure of about 15 MPa are used in the CO2 extraction, on the other hand, thus the processing temperature may be lowered.

The supercritical dryer and method to dry the aerogel layer is described hereinafter with reference to FIG. 2.

Figure 2:
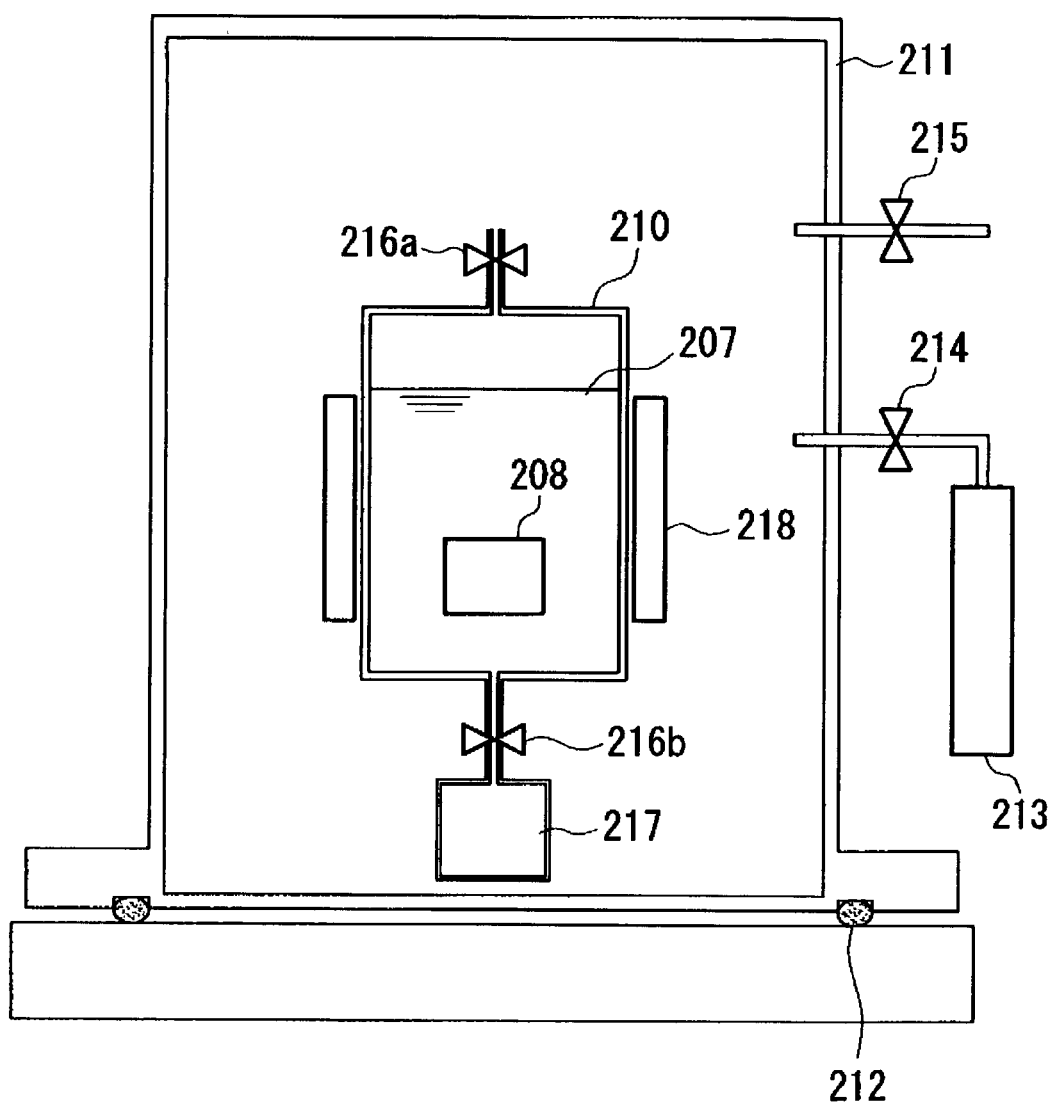
FIG. 2 is a schematic showing an example of the supercritical drying apparatus.
Figure 3:
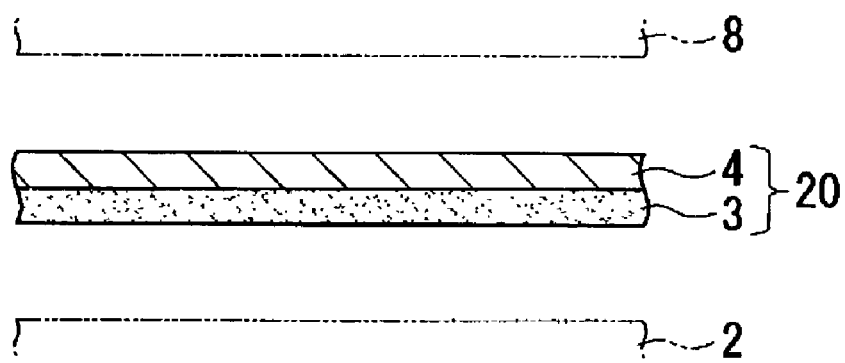
FIG. 3 is a cross-sectional view showing an example of the laminated layer formed by the method for manufacturing the electro-optical device according to the present invention.

The supercritical dryer shown in FIG. 2 includes a supercritical fluid contained 210 to place a solvent 207 and drying object 208 including the aerogel coated on the substrate, and an external chamber 211 capable of housing the supercritical fluid container 210. The external vessel is made of, for example, FRP, sealed with an O-ring 212, and the inner pressure of the external chamber 211 is maintained at a high pressure by feeding a compressed nitrogen gas (an inert gas) from a nitrogen cylinder 213 through a flow control valve 214. Nitrogen gas in the external chamber 211 is discharged through a conduit having a discharge valve 215 after completing supercritical drying.

The supercritical fluid container 210 is made of stainless steel, and is able to tightly seal the solvent 207 and drying object 208 in the container. A temperature controller 218 including an induction coil (induction heater) or a heater is provided at the outside of the vessel. A pressure control valve 216a is provided on the outer wall (on the upper outer wall) of the supercritical fluid container 210, where the pressure control valve is adjusted so that it is operated to open when the pressure in the external chamber 211 (referred to as an external pressure for convenience sake) is higher by a predetermined pressure (for example 0.1 MPa or more) than the pressure in the supercritical fluid container 210 (referred to as an inner pressure for convenience sake). A filter (not shown) is preferably interposed in the pressure control valve 216a to prevent particles from flowing into the vessel.

A solvent discharge valve 216b is provided on the other part of the outer wall of the supercritical liquid container 210 (on the lower outer wall), where the solvent discharge valve is adjusted so that it is operated to open when the external pressure is decreased by a predetermined pressure, for example, 0.1 MPa or more from the inner pressure. A retrieval vessel 217 is provided at the outside of the supercritical fluid container 210 and at the inside of the external chamber 211, so that the solvent appropriately discharged from the solvent discharge valve 216b is retrieved in this retrieval vessel 217a.

The supercritical method using the supercritical dryer is described hereinafter with reference to FIG. 2. The wet gel layer is formed on the surface of the substrate by the spin coat method.

Then, the wet gel layer is dried by supercritical drying using the apparatus shown in FIG. 2. The wet gel layer and ethanol are sealed in the supercritical fluid container 210 of the supercritical dryer in a clean room, and the external chamber 211 is tightly sealed after placing the supercritical fluid container 210 in the external camber 211.

Compressed nitrogen gas from the nitrogen gas cylinder 213 is fed into the external chamber 211 thereafter by opening the flow control valve 214 to pressurize the pressure in the external vessel (external pressure). The pressure control valve 216a is operated to open in this process to pressurize the inside of the supercritical fluid container 210 housing the wet gel layer and ethanol.

Subsequently, the temperature of the supercritical fluid container 210 is increased to a predetermined temperature with the temperature controller 218. When the inner pressure of the supercritical fluid container 210 (inner pressure) has became higher than the inner pressure of the external chamber 211 (external pressure) in this temperature increase process, ethanol is discharged by opening the solvent discharge valve 216b and is retrieved in the retrieval vessel 217. In other words, the solvent discharge valve 216b functions as a safety valve in this process. While the solvent discharged is in a supercritical state, it returns to a liquid state as soon as it is discharged from the vessel. Consequently, the inner pressure as well as the supercritical state are maintained to proceed supercritical drying.

When nitrogen gas in the external chamber 211 is discharged thereafter by opening the discharge valve 215 to decrease the pressure in the external chamber 211 to the atmospheric pressure, the solvent discharge valve 216b is operated to open, and ethanol is discharged from the supercritical fluid container 210 and retrieved in the retrieval vessel 217. Then, dry nitrogen gas is allowed to flow from the nitrogen gas cylinder 213 to completely remove ethanol in the supercritical fluid container 210, which is cooled to room temperature. Finally, the supercritical fluid container 210 is taken out of the external chamber 211, and is open in the clean room to retrieve the drying object 208.

Since ethanol is eliminated from the layer with no gas-liquid interface in the layer by using the supercritical drying method, the gel is not substantially contracted by the surface tension without contraction of the network structure of the wet gel (the solution of the starting material), enabling a porous layer having a high void ratio to be obtained by eliminating the liquid phase (for example solvent) and impurities such as monomers.

The method to form the silica aerogel layer (low refractivity layer) 3 has been described above. The seal layer 4 including the silicon oxide nitride is formed on the low refractivity layer 3 formed on the substrate 2 by the plasma CVD method to manufacture the electroluminescence display 1 shown in FIG. 1. The method to form the seal layer 4 may be appropriately selected depending on the various material used to construct the seal layer. Then, the positive electrode 8 is formed on the seal layer 4 by sputtering, ion plating or vacuum deposition, and the positive hole transfer layer 6, luminous layer 5 and negative electrode 7 are sequentially laminated on the positive electrode 8, thereby manufacturing the organic electroluminescence display 1.

The light projected out of the luminous layer 5 permeates the transparent electrode 8, and impinges into the substrate 2 through the seal layer 4 and low refractivity layer 3 in the electroluminescence display 1 having the construction as described above. Since the silica aerogel layer 3 as the low refractivity layer is maintained to have a high void ratio by applying the supercritical drying method with a lower refractivity than the substrate 2 including glass and quartz crystal, the light is impinged from a low refractivity material into a high refractivity material. Consequently, the incident light impinging into the silica aerogel layer with an angle larger than the critical angle is refracted into a direction with an angle smaller than the critical angle at the interface between the low refractivity layer and the substrate 2. Since this condition is out of the total reflection condition in the substrate 2, the light that has been totally reflected in the conventional construction can be guided to the outside in the construction according to the present invention.

The silica aerogel layer 3 can be dried without being exposed to an excessively high temperature and low pressure environment, by forming the silica aerosol layer by drying the wet gel layer by the supercritical drying method as described above. Accordingly, the shape of the aerogel as a porous material is maintained with no collapse of the void while maintaining its chemical property. In addition, since the solvent and impurities such as monomers are sufficiently eliminated, the organic electroluminescence material is prevented from deterioration ascribed to these impurities, enabling good optical characteristics to be maintained.

The high void ratio is maintained in the silica aerogel layer 3 with good luminous characteristics of the luminous layer 5. Therefore, the organic electroluminescence display having good recognition of vision can be manufactured by projecting the light emitted from the luminous layer 5 to the outside.

The silica aerogel layer 3 was formed by drying the wet gel applied on the substrate 2 by spin coating by the supercritical drying method in this embodiment. However, the silica aerogel layer may be formed by coating the wet gel on a different base material (base), and a laminated film 20 including the silica aerogel layer 3 and seal layer 4 is previously formed followed by bonding the laminated layer 20 on the substrate 2.

While the low refractivity layer 3 was formed on the substrate 2, and the seal layer 4 was formed on the low refractivity layer 3 in this embodiment, the seal layer 4 may be formed on the substrate 2, and the low refractivity layer 3 may be formed on the seal layer 4. This means that the layer structure between the positive electrode 8 (organic electroluminescence element) 9 and the substrate 2 may be a laminated structure of substrate 2/low refractivity layer 3/sela layer 4/positive electrode 8, or a laminated structure of substrate 2/seal layer 4/low refractivity layer 3/positive electrode 8. Alternatively, plural seal layers may be provided, such as a laminated structure of substrate 2/seal layer 4/low refractivity layer 3/seal layer 4/positive electrode 8.

A synthetic resin (an organic substance) may be mixed with the wet gel in forming the wet gel for the silica aerogel layer 3. The synthetic resin to be used for this purpose is a light permeable resin having a heat denaturation temperature higher than the critical temperature of the supercritical fluid. Examples of the light permeable resin having a heat denaturation temperature higher than the critical temperature of alcohols used as the supercritical fluid include hyrdoxypropyl cellulose (HPC), polyvinyl butyral (PVB) and ethyl cellulose (EC). PVC and EC is soluble in alcohols and insoluble in water. It is desirable to select chlorinated polyethylene as the resin when ether is used as the solvent, and to select HPC when $CO_2$ is used as the solvent.

The synthetic resins and organic substances may be dried at a relatively low temperature by drying by the supercritical drying method even when the synthetic resins and organic substances are added in the material layers to be dried, thereby enabling the synthetic resin (organic substance) from being denatured caused by high temperature drying.

While the layer dried by the supercritical drying method has been described to be the silica aerogel layer (low refractivity layer) 3 in this embodiment, the luminous layer. Positive hole transfer layer or electron transfer layer may be dried by the supercritical crying method. Solvents and impurities, such as monomers may be sufficiently eliminated from the luminous layer, positive hole transfer layer, electron transfer layer and seal layer while decreasing contraction of the volume of the layers.

While the low refractivity layer 3 is the silica aerogel layer 3 in this embodiment, the layer may be an alumina based layer, and any porous layers having a lower refractive index than the substrate 2 while being light permeable may be used. The density of the porous material (aerogel) is preferably 0.4 g/cm$^3$.

The low refractivity layer 3 is not always required to be the porous material, and an adhesive including a polymer material being light permeable and having a lower refractive index than the substrate 2 such as an epoxy based adhesive (refractive index: 1.42) and acrylic adhesive (refractive index 1.43). The low refractivity layer 3 including these polymer materials is also dried by the supercritical drying method.

The light emitting efficiency may be enhanced due to the lower refractive index of the layer than the glass or quartz crystal constituting the substrate 2, even when the adhesive is used alone. The organic electroluminescence display 1 may be manufactured by bonding the substrate 2 and seal layer 4 with the adhesive.

The low refractivity layer 3 may be porous silica, magnesium fluoride (refractive index: 1.38) or a material containing thereof. The low refractivity layer 3 including magnesium fluoride may be formed by sputtering. Alternatively, the layer may be a gel prepared by dispersing fine particles of magnesium fluoride. Alternatively, the layer may include a fluorinated polymer or a material containing thereof, for example perfluoroalkyl-polyether, perfluoroalkyl amine or a mixed layer of perfluoroalkyl-polyether and perfluoroalkyl amine.

A low refractive index fluorocarbon compound soluble or dispersible in a polymer binder may be mixed in the layer.

The polymer binders available include polyvinyl alcohol, polyacrylic acid, polyvinyl pyrrolidone, sodium polyvinyl sulfonate, polyvinylmethyl ether, polyethylene glycol, poly-α-trifluoromethyl acrylic acid, polyvinylmethyl ether-maleic anhydride copolymer, polyethyleneglycol-propyleneglycol copolymer and polymethacrylic acid.

Examples of the fluorocarbon compound include ammonium perfluorooctanoate, tetramethyl ammonium perfluorooctanoate, C-7 and C-10 ammonium perfluoroalkyl sulfonate, C-7 and C-10 tetramethyl ammonium perfluoroalkyl sultanate, fluorinated alkyl quaternary ammonium iodide, perfluoroadipic acid and quaternary ammonium perfluoroadipate.

Since the method to introduce voids is effective to form the low refractivity layer 3, fine particles as micro-voids between or in the fine particles may be used to form the voids. Inorganic fine particles or organic fine particles may be used for the low refractivity layer. A desired void ratio can be maintained by treating the layer under the supercritical condition to enable the refractive index to be suppressed from increasing.

The inorganic fine particles are preferably amorphous particles. The inorganic fine particles preferably include metal oxides, metal nitrides and metal sulfides, more preferably metal oxides or metal halides, and particularly metal oxides and metal fluorides. The preferable metal elements include Na, K, Mg, Ca, Ba, Al, Zn, Fe, Cu, Ti, Sn, In, W, Y, Sb, Mn, Ga, V, Nb, Ta, Ag, Si, B, Bi, Mo, Ce, Cd, Be, PB and NI, and Mg, Ca, B and Si are more preferable. Inorganic compounds containing two kinds of metals may be used. The particularly preferable inorganic compound is silicon dioxide, or silica.

The micro-void in the inorganic fine particles may be formed by cross-linking the silica molecules constituting the particles. The volume of the silica molecule decreases by cross-linking, and the particle becomes porous. The inorganic fine particles containing the micro-void (porous fine particles) are directly synthesized as a dispersion by a sol-gel method (Japanese unexamined Patent Publication No. 53-112732 and Japanese Patent Publication No. 57-9051) or precipitation method (APPLIED OPTICS, 27, p3356, 1988). The dispersion may be obtained by mechanically crushing the powder obtained by precipitation and drying. Commercially available porous inorganic fine particles (for example, silicon dioxide sol) may be used. The inorganic fine particles including the micro-voids is preferably used by dispersing in an appropriate solvent to form the low refractivity layer. The preferable dispersing media include water, alcohol (such as methanol ethanol, isopropyl alcohol) and ketone (methylethyl ketone, methylisobutyl ketone).

A related art hydrocarbon polymer, such as polyethylene, polystyrene and polypropylene, may be available as a material to constitute the organic fine particles. Polymer fine particles synthesized by a polymerization reaction of a monomer (for example, emulsion polymerization) may be also used.

The polymer available includes a fluorinated polymer containing fluorine atoms. Examples of the monomers containing the fluorine atoms to synthesize fluorinated polymers include fluoroolefin (fluoroethylene, vinylidene fluoride, tetrafluoroethylene, hexafluoropropylene, perfluoro-2,2-dimethyl-1,3-dioxol) and fluorinated alkyl esters of acrylic acid or methacrylic acid, and fluorinated vinylether. A copolymer of monomers containing and not containing the fluorine atoms may be used. Examples of the monomer not containing the fluorine atoms include olefin (ethylene, propylene, isobutylene, vinyl chloride, vinylidene chloride), acrylic ester (methyl acrylate, ethyl acrylate, 2-ethylhexyl acrylate), methacrylic ester (methyl methacrylate, ethyl methacrylate, butyl methacrylate), styrene (styrene, vinyl toluene, α-methyl styrene), vinyl ether (methylvinyl ether), vinyl ester (vinyl acetate, vinyl propionate), acrylamide (N-t-butyl acrylamide, N-cyclohexyl acrylamide), methacrylamide and acrylonitrile.

The micro-voids in the organic fine particles may be formed by cross-linking the polymer to form the particles. The volume of the polymer decreases by cross-linking, and the particles become porous. For cross-linking the polymer to form the particles, it is preferable that the monomer to synthesize the polymer preferably contains 20 mol % or more of polyfunctional monomers. The proportion of the polyfunctional monomer is preferably 30 to 80 mol %, particularly 35 to 50 mol %. Examples of the polyfunctional monomer include diene (butadiene, pentadiene), esters of polyfunctional alcohols and acrylic acid (ethyleneglycol diacrylate, 1,2,4-cyclohexane diacrylate, dipentaerythritol hexaacrylate), esters of polyfunctional alcohols and methacrylic acid (ethyleneglycol dimethacrylate, 1,2,4-cyclohexane tetramethacrylate, pentaerythritol tetramethacrylate), divinyl compounds (divinyl cyclohexane, 1,4-divinyl benzene), divinyl sulfone, bisacrylamide (methylene bisacrylamide) and bismethacrylamide. The micro-voids among the particles may be formed by stacking two or more particles.

The low refractivity layer 3 may include a material containing fine voids and inorganic fine particles. The low refractivity layer 3 is formed by coating, and the fine voids are formed by allowing a gas to be eliminated from the layer by treating with an activated gas after application of the layer. Otherwise, two kinds or more of the fine particles (for example $MgF_2$ and $SiO_2$) may be mixed, and the mixing ratio may be changed in the direction of thickness of the layer to form the low refractivity layer 3. The refractive index is changed by changing the mixing ratio. The fine particles are adhered with $SiO_2$ formed by thermal decomposition of ethyl silicate. Carbon dioxide and water vapor are also generated by combustion of the ethyl moiety in the thermal decomposition of ethyl silicate. The voids are formed by elimination of carbon dioxide and water vapor. Alternatively, the low refractivity layer 3 may be formed by allowing the inorganic fine particles including porous silica and a binder to contain, or the low refractivity layer 3 containing voids among the fine particles may be formed by stacking two or more fine particles comprising the fluorinated polymer.

The void ratio may be improved in a molecular structure level. For example, low refractive index may be obtained using a polymer including branched structures, such as dendrimers.

The low refractivity layer 3 using the materials above is preferably adjusted to have a refractive index of 1.4 or less. The layer has a lower refractive index than the substrate 2 when quartz crystal (refractive index: 1.45) and glass (refractive index: 1.54) are used for the substrate 2.

The low refractivity layer 3 may be formed as a porous $SiO_2$ layer, instead of forming the silica aerogel layer using the supercritical drying method. The $SiO_2$ layer is formed by the plasma CVD method (plasma chemical vapor deposition method) using $SiH_4$ and $N_2O$ as reaction gases. The porous $SiO_2$ layer is formed on the $SiO_2$ layer.

The $SiO_2$ layer is formed by an atmospheric pressure CVD method (atmospheric pressure chemical vapor deposition method) using a reaction gas including TEOS (tetraethoxy silane), $O_2$ (oxygen) and a low concentration of ozone ($O_3$). The low concentration $O_3$ as used herein refers to as $O_3$ with a lower concentration than is necessary for oxidation of TEOS.

A polymer layer may be interposed between the seal layer (barrier layer) 4 and positive electrode 8. Related art hydrocarbon polymers, such as polyethylene, polystyrene and polypropylene, may be used for the material to form the polymer layer. Polymer fine particles synthesized by a polymerization reaction of monomers (for example, emulsion polymerization) may be also used. Fluorinated polymers containing fluorine atoms may be used as well. Examples of the fluorine atom containing monomers to synthesize the fluorinated polymers include fluoroolefin (fluoroethylene, vinylidene fluoride, tetrafluoroethylene, hexafluoropropylene, perfluoro-2,2-dimethyl-1,3-dioxol), fluorinated alkyl esters of acrylic acid or methacrylic acid, and fluorinated vinylether. A copolymer of a monomer containing fluorine atoms and a monomer not containing fluorine atoms may be used. Examples of the monomer not containing the fluorine atoms include olefin (ethylene, propylene, isoprene, vinyl chloride, vinylidene chloride), acrylic acid ester (methyl acrylate, ethyl acrylate, 2-ethylhexyl acrylate), methacrylic acid ester (methyl methacrylate, ethyl methacrylate, butyl methacrylate), styrene (styrene, vinyl toluene, α-methyl styrene), vinyl ether (methylvinyl ether), vinyl ester (vinyl acetate, vinyl propionate), acrylamide (N-t-butyl acrylamide, N-cyclohexyl acrylamide), methacrylamide and acrylonitrile.

To form the polymer layer as the upper layer of the seal layer 4, the low refractivity layer 3 and seal layer 4 are formed on the substrate, and a monomer (or a precursor) of the polymer is applied on the surface of the seal layer (barrier layer or base) as shown in FIG. 4(a). Since the monomer has high fluidity, it is planarized after applying on the surface of the seal layer 4. The polymer layer 12 is then formed by curing or polymerizing the applied monomer as shown in FIG. 4(b). The polymer layer 12 is planarized by forming the polymer layer 12 by curing or polymerization of the monomer after applying the highly fluid monomer, thereby serving to reduce structural defects of the seal layer 4. Since the structural defects of the seal layer 4 is reduced with the polymer layer 12, the seal layer 4 can exhibit a good barrier property.

Impurities, such as the monomer (or precursor) and solvent remaining in the polymer layer 12, are sufficiently removed by drying the polymer layer 12 under a supercritical condition as shown in FIG. 4(c), thereby suppressing change of the shape, such as contraction of the volume to its minimum. When the polymer layer 12 is porous, a high void ratio is maintained with no collapse of the voids to enable good light emission efficiency to be secured. The anode 8 is formed on the surface of the polymer layer 12 as shown in FIG. 4(d) after forming the polymer layer 12 as described above.

While FIGS. 4(a)–4(d) shows the layer structure of substrate 2/low refractivity layer 3/seal layer 4/polymer layer 12/positive electrode 8 in which the polymer layer 12 is formed between the seal layer 4 and positive electrode 8, the layer structure may be substrate 2/low refractivity layer 3/polymer layer 12/seal layer 4/positive electrode 8 in which the polymer layer is formed between the low refractivity layer 3 and seal layer 4. Otherwise, the seal layer 4 may be disposed below the substrate 2.

Alternatively, the layer structure may be substrate 2/seal layer 4/polymner layer 12/low refractivity layer 3/positive electrode 8. The polymer layer 12 may be formed by applying the monomer on the base including substrate 2/seal layer 4, followed by drying by the supercritical drying after curing or polymerization of the monomer. Structural defects in the seal layer 4 may be reduced by the polymer layer 12.

Otherwise, the polymer layer 12 and seal layer (barrier layer) 4 may be interposed between the substrate 2 and positive electrode 8 without providing the low refractivity layer 3.

Figure 5:
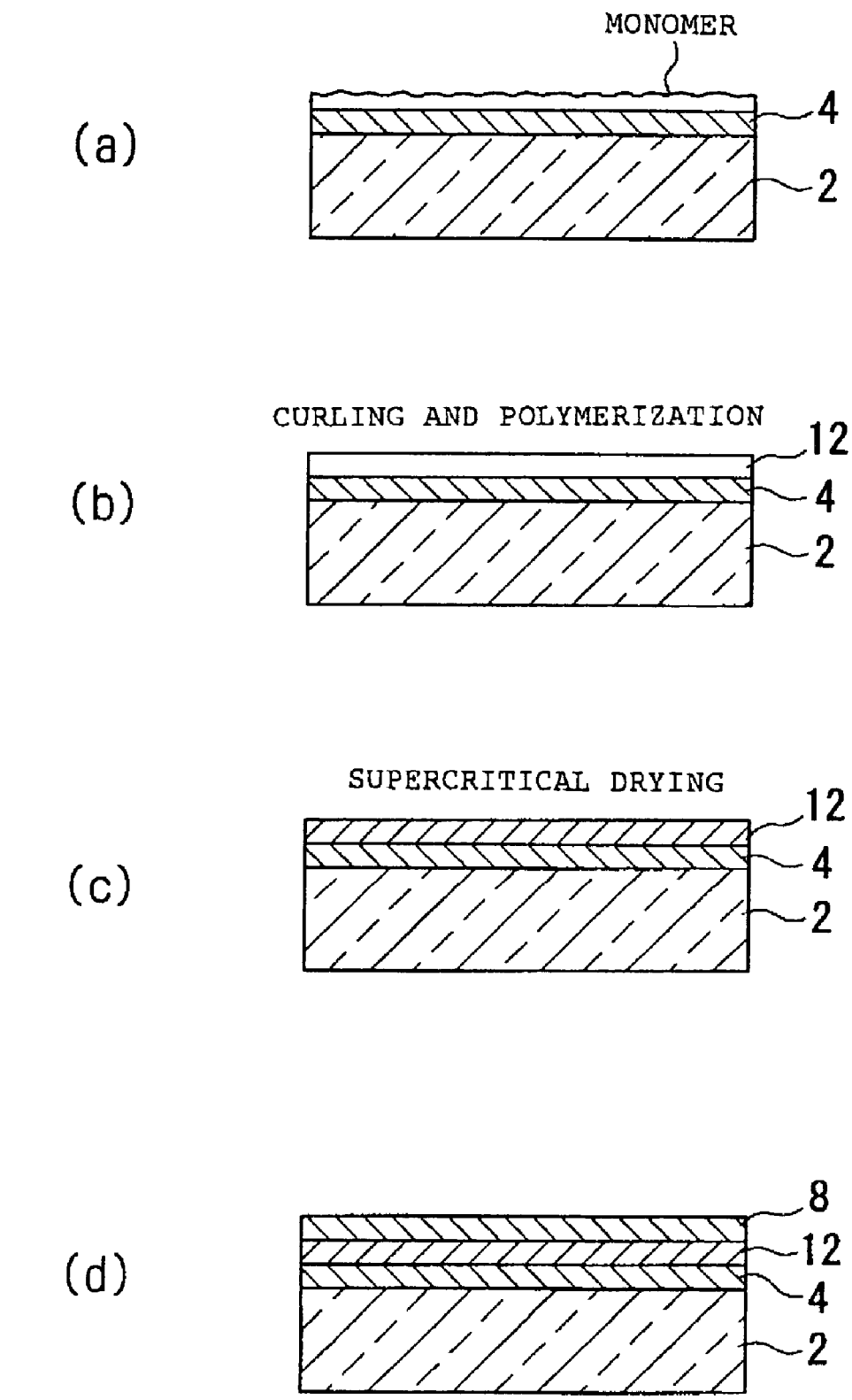
FIGS. 5(a) to 5(d) are cross-sectional views describing the method for manufacturing the electro-optical device according to the present invention.

To form the polymer layer 12 on the seal layer 4, the monomer (or precursor) of the polymer is applied on the surface of the seal layer (barrier layer) 4 after forming the seal layer 4 on the substrate 2, as shown in FIG. 5(a). Then, as shown in FIG. 5(b), the applied monomer is cured or polymerized to from the polymer layer 12. The polymer layer 12 is planarized by forming the polymer layer 12 by curing or polymerization after applying the monomer having high fluidity, thereby allowing the polymer layer to function as a layer to reduce the structural defects of the seal layer 4.

After forming the polymer layer 12, the polymer layer 12 is dried by supercritical drying as shown in FIG. 5(c). The solvent and monomers are sufficiently removed from the polymer layer 12 while suppressing the change of the shape such as volume contraction to its minimum. A high void ratio is maintained with no collapse of the void when the polymer layer 12 is porous, ensuring good light emission efficiency. The positive electrode 8 is formed on the polymer layer 12 as shown in FIG. 5(d) after forming the polymer layer 12. Since providing the polymer layer 12 for reducing structural defects in the seal layer 4 permits the seal layer 4 to exhibit good barrier performance, water, oxygen and various metal ions are prevented from permeating into the display.

Figure 6:
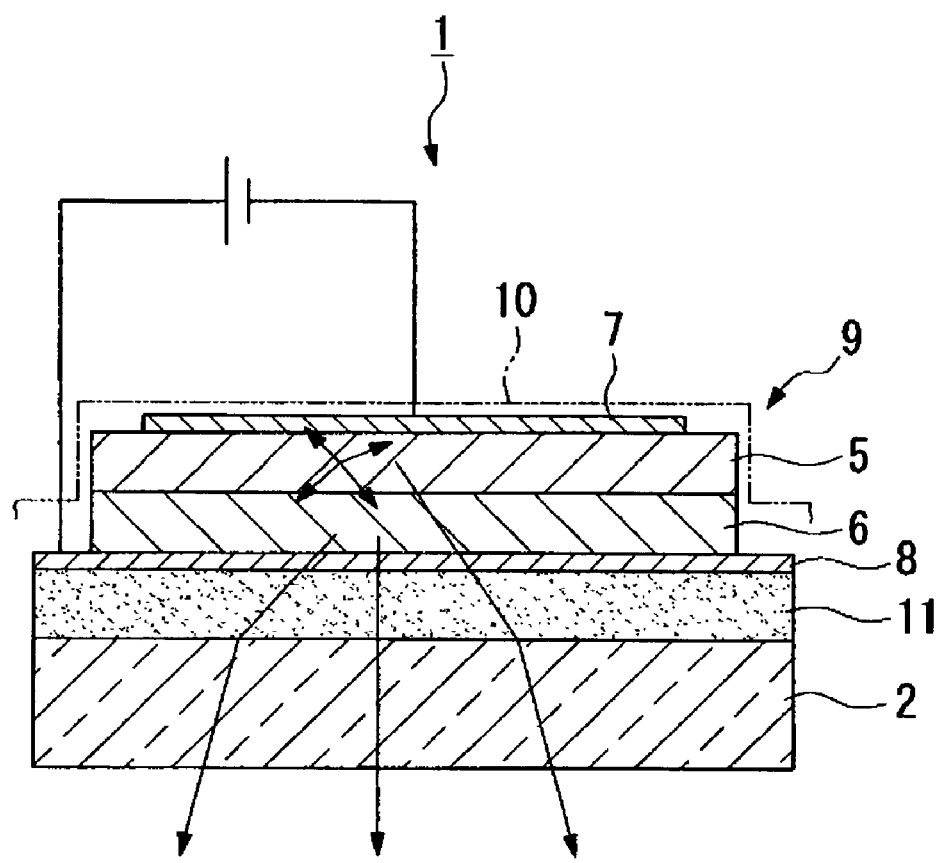
FIG. 6 is a cross-sectional view of an example of the construction of the laminated layer formed by the method for manufacturing the electro-optical device according to the present invention.

The low reflective index layer 11 of the organic electroluminescence display as shown in FIG. 6 may be dried by the supercritical drying method according to the present invention.

The organic electroluminescence display 1 shown in FIG. 6 includes a light permeable substrate 2, an organic electroluminescence element 9 provided at one surface of the substrate 2 and providing a luminous layer 5 and positive hole transfer layer 6 interposed between a pair of electrodes 7 and 8, and a low refractivity layer 11 provided between the substrate 2 and positive electrode 8 of the electroluminescence element 9 and having a low refractive index than the substrate 2. At least one of drying agent or adsorbent is dispersed in the low refractivity layer 11.

Although the organic electroluminescence display 1 shown in FIG. 6 has no seal layer, the low refractivity layer 11 is endowed with plural functions of low refractive index and suppression of permeation of various deteriorating factors such as water, oxygen and metal ions by allowing the drying agent or adsorbent to disperse in the material constituting the low refractivity layer as described in the foregoing embodiment.

The materials constituting the low refractivity layer described above may be used for the low refractivity layer 11 in this embodiment. Furthermore, the low refractivity layer 11 may be endowed with the function as the barrier layer by adding a substance containing at least one element selected from the elements of boron, carbon, nitrogen, aluminum, silicon, phosphorous, cerium, ytterbium, samarium, erbium, yttrium, lanthanum, gadolinium, dysprosium and neodymium; or by adding magnesium oxide, magnesium carbonate, iron oxide, titanium oxide, bentonite, acid clay, montmorillonite, diatomite, activated alumina, silica alumina, zeolite, silica, zirconia, oxides of alkali earth metals such as calcium oxide and barium oxide, halogenated alkali earth metals such as calcium chloride, and phosphorous pentoxide.

Since the low refractivity layer may be endowed with good heat conductivity by adding a substance containing at least one element selected from the elements of boron, carbon, nitrogen, aluminum, silicon, phosphorous, cerium, ytterbium, samarium, erbium, yttrium, lanthanum, gadolinium, dysprosium and neodymium of the substances to be added as described above, the low refractivity layer 11 also functions as a radiator to dissipate the heat generated by operating the electroluminescence device.

Volume contraction may be suppressed by eliminating the solvent and impurities under the supercritical condition in forming the low refractivity layer 11.

The low refractivity layer 11 including the drying agent is formed into a layer-like member using the supercritical drying method, and this layer-like member is interposed between the substrate 2 and positive electrode 8 in this embodiment.

While the organic electroluminescence device has been described as an example of the electro-optical device, the embodiment is also applicable to various electro-optical devices, such as a liquid crystal device, an electrophoresis device in which the image is displayed by allowing charged particles to be biased by an electric field, a field emission device, and an electron discharge type luminous device in which a luminous layer is made to emit a light using the electrons discharged from an electron discharge element.

The method for manufacturing the electro-optical device according to the present invention is described hereinafter with reference to FIGS. 7, 8 and 9, where the method is applied to a method for manufacturing an active matrix type display using the organic electroluminescence element.

Figure 7:
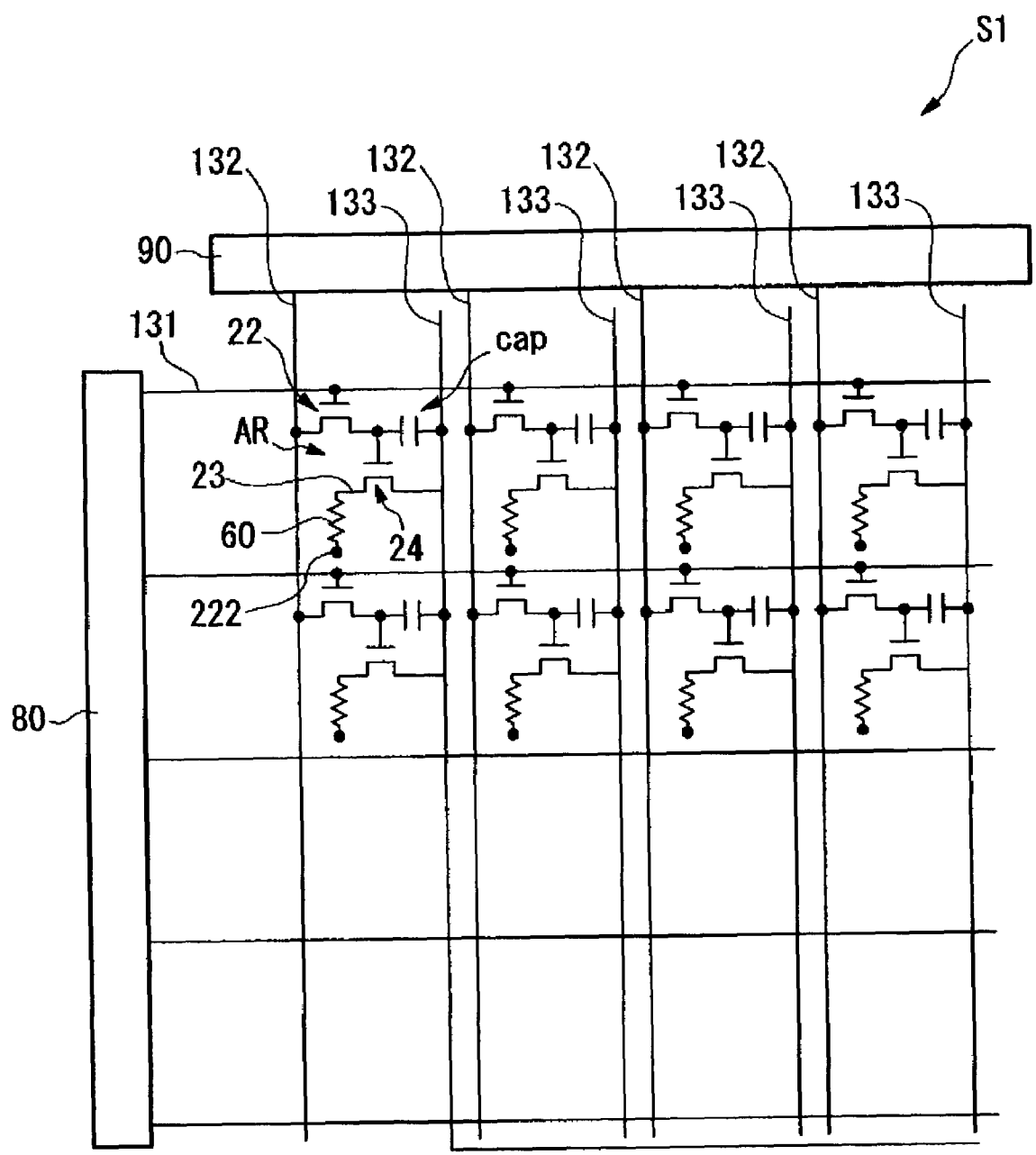
FIG. 7 is a circuit diagram of the active matrix type organic electroluminescence display.
Figure 8:
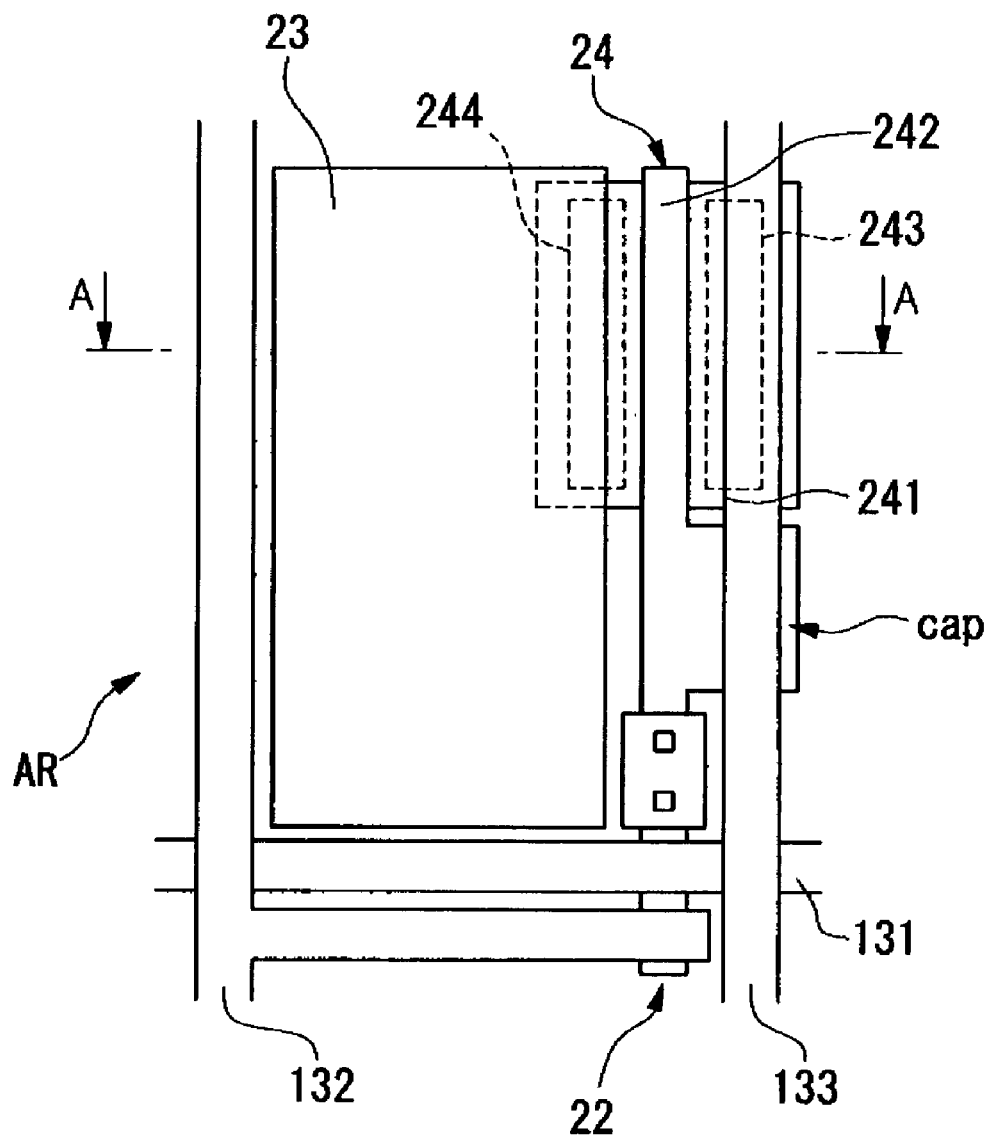
FIG. 8 is a magnified schematic showing the planar structure of the pixel in the display shown in FIG. 7.

FIG. 7 is a circuit diagram of the organic electroluminescence display, and FIG. 8 is a magnified plan view of a pixel when an opposed electrode and organic electroluminescence element are removed.

As shown in the circuit diagram in FIG. 7, the electroluminescence display S1 includes a plurality of scanning lines 131, a plurality of signal lines 132 extending in the direction perpendicular to the scanning lines 131, and a plurality of common power lines 133 extending in parallel to the signal lines 133 wired on a substrate. The pixel (pixel region) AR is provided corresponding to each cross point between the scanning line 131 and signal line 132.

A data line addressing circuit 90 including a shift resistor, level shifter, video line and analogue switch is provided for each signal line 132.

A scanning line addressing circuit 80 including a shift resistor and level shifter is provided for each scanning line 131. Each pixel region AR includes a first thin film transistor 22 that supplies scanning signals to a gate electrode via the scanning line 131, a capacitor cap that retains image signals supplied from the signal line 132 via the first thin film transistor 22, a second thin film transistor 24 that supplies image signals retained via the capacitor cap to the gate electrode, a pixel electrode 23 in which an addressing current flows from the common power line 133 when electrically connected to the common power line 133 via the second thin film transistor 24, and a luminous member (luminous layer) 60 interposed between the pixel electrode (positive electrode) 23 and opposed electrode (negative electrode) 222.

When the first thin film transistor 22 is turned on by addressing the scanning line 131 in the circuit so constructed as described above, the potential of the signal line 132 at the moment is retained in the capacitor cap, and electrical continuity of the second thin film transistor 24 is determined depending on the level of the capacitor cap. An electric current flows from the common power line 133 into the pixel electrode 23 via the channel of the second thin film transistor 24, and the luminous layer 60 emits a light depending on the magnitude of the electric current when the electric current further flows into the opposed electrode 222 through the luminous layer 60.

In the planar structure of each pixel AR as shown in FIG. 8, four edges of the planar rectangular pixel electrode 23 are surrounded by the signal line 132, common power line 133, scanning line 131 and a scanning line for another pixel electrode (not shown), respectively. When luminous layer and carrier transfer layer are disposed on the pixel electrode using a liquid by an ink-jet apparatus, dispenser or micro-spotting apparatus, the pixel electrode may preferably has a circular or ellipsoidal shape with no corners, although this configuration is not shown in the FIG. 8.

Figure 9:
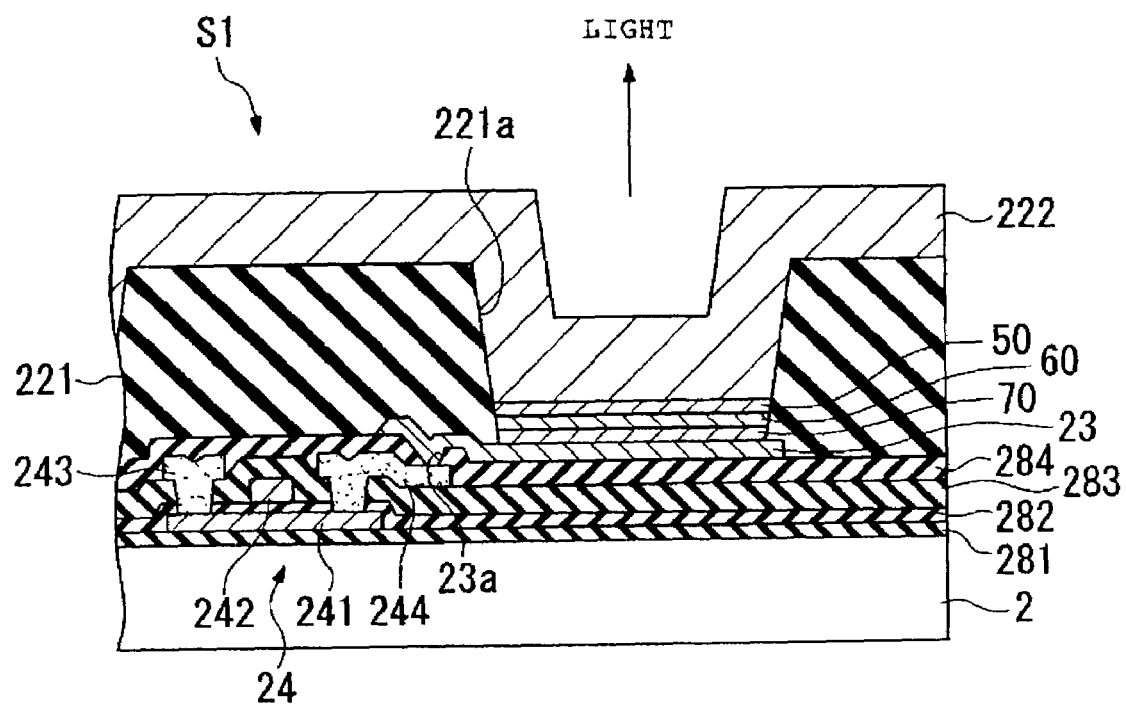
FIG. 9 is a cross-sectional view that shows an example of the layer structure of the organic electroluminescence display manufactured by the method for manufacturing the electro-optical device according to the present invention.
Figure 10:
FIGS. 10(a) to 10(e) are cross-sectional views describing one example of the method for manufacturing the electro-optical device according to the present invention.
Figure 10:
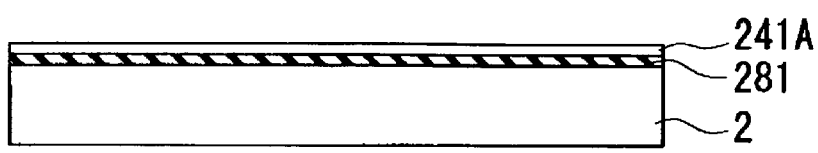
Figure 10:
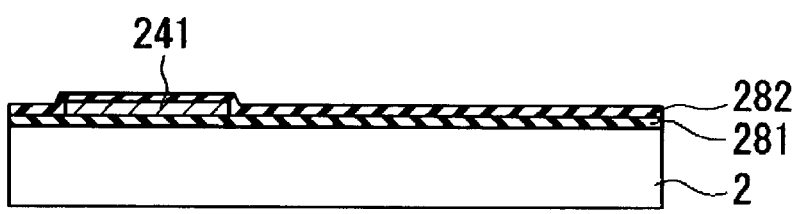
Figure 10:
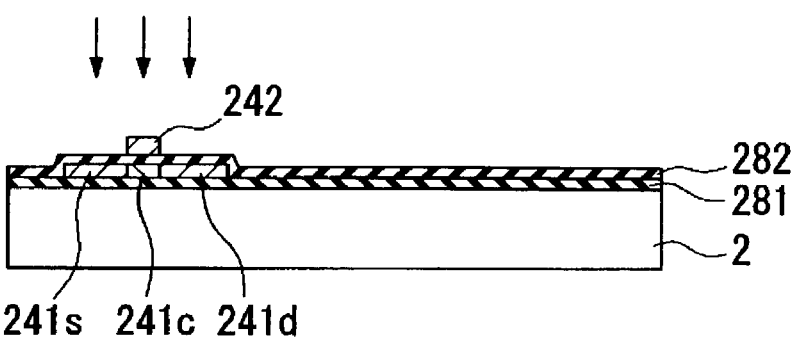
Figure 10:
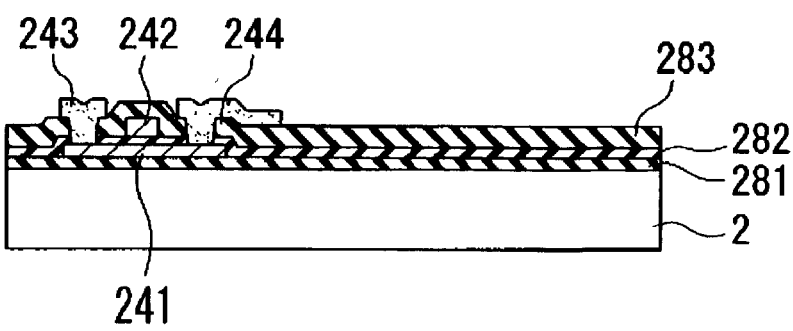
Figure 11:
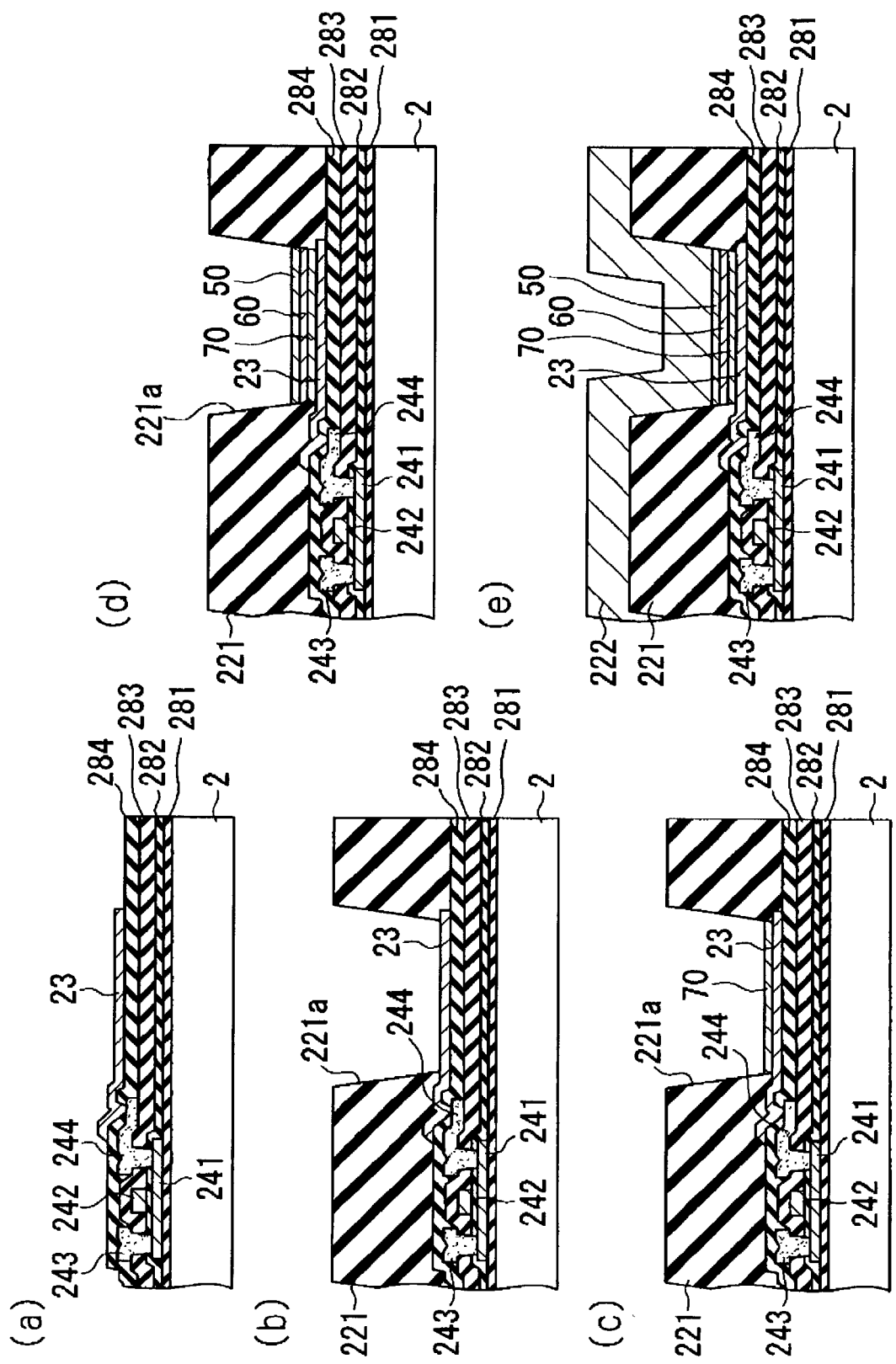
FIGS. 11(a) to 11(e) are cross-sectional views describing one example of the method for manufacturing the electro-optical device according to the present invention.

FIG. 9 is a cross-sectional view of the pixel shown in FIG. 8 as viewed along plane A—A in FIG. 8. The light is emitted from the opposed side to the side of the substrate 2 on which the thin film transistor (TFT) is mounted in the organic electroluminescence display shown in FIG. 9.

As shown in FIG. 9, the organic electroluminescence display SI includes a substrate 2, a positive electrode (pixel electrode) 23 including a trans parent electrode material, such as indium tin oxide (ITO), a positive hole transfer layer 70 capable of transferring positive holes from the positive electrode 23, a luminous layer (an organic electroluminescence layer) 60 containing an organic electroluminescence material as one of the electro-optical materials, an electron transfer layer 50 provided on the surface of the luminous layer 60, a negative electrode (opposed electrode) 222 provided on the surface of the electron transfer layer 50 and including aluminum (Al), magnesium (Mg), gold (Au), silver (Ag) and calcium (Ca), and a thin film transistor (referred to as TFT) that is formed on the substrate 2 and regulates the electric current flowing between the pixel electrode 23 and negative electrode 222. The TFT 24 is operated based on the signals supplied form the scanning line addressing circuit 80 and data line addressing circuit 90.

The TFT 24 is provided on the surface of the substrate 2 with interposition of a protective underlayer 281 mainly including $SiO_2$. The TFT 24 includes a silicon layer 241 formed on the surface of the protective underlayer 281; a gate insulation layer 282 provided on the surface of the protective underlayer 281 so as to cover the silicon layer 241; a gate electrode 242 provided at the opposed portion to the silicon layer 241 of the surface of the gate insulation layer 282; a first interlayer insulation layer 283 provided on the surface of the gate insulation layer 283 so as to cover the gate electrode 242; a source electrode 243 electrically connected to the silicon layer 241 through a contact hole opening through the gate insulation layer 238 and first interlayer insulation layer 283; and a drain electrode 244 that is provided at a position opposed to the source electrode 243 with interposition of the gate electrode 242, and is electrically connected to the silicon layer 241 through a contact hole opening through the gate insulation layer 282 and first interlayer insulation layer 283; and a second interlayer insulation layer 284 provided on the surface of the first interlayer insulation layer 283 so as to cover the source electrode 243 and drain electrode 244.

The pixel electrode 23 is disposed on the surface of the second interlayer insulation layer 284, and the pixel electrode 23 is electrically connected to the drain electrode 244 via the contact hole 23a formed through the second interlayer insulation layer 284. A third insulation layer (ban layer) 221 including a synthetic resin is provided between a portion on the surface of the second interlayer insulation layer 284, other than the portion where the electroluminescence element is provide, and the negative electrode 222.

The region of the silicon layer 241 that overlaps the gate electrode 242 with interposition of the gate insulation layer 282 is defined to be a channel region. A source region is provided at the source side of the channel region of the silicon layer 241, while a drain region is provided at the drain side of the channel region. The source region is connected to the source electrode 243 through a contact hole opening through the gate insulation layer 282 and first interlayer insulation layer 283. The drain region is connected, on the other hand, to the drain electrode 244 including the same layer as the source electrode 243 through a contact hole opening through the gate insulation layer 282 and first interlayer insulation layer 283. The pixel electrode 23 is connected to the drain region of the silicon layer 241 via the drain electrode 244.

Since the emitted light is emitted from the opposed side to the substrate 2 providing the TFT 24 (a top emission type element) in this embodiment, the substrate 2 may be opaque, and ceramics such as alumina, a metal sheet such as a stainless steel sheet having a surface insulation layer by applying a surface oxidation treatment, a thermosetting resin and a thermoplastic resin may be used for the substrate.

It is also possible to construct the organic electroluminescence element to have a construction in which the emitted light is emitted from the substrate side providing the TFT (a back emission type element). While a transparent or semi-transparent material, such as a glass, quartz crystal or a resin, may be used for the material of the substrate when the emitted light is emitted from the substrate side, an inexpensive soda glass is favorably used. It is preferable to protect the soda glass that is susceptible to an acid and alkali and to planarize the surface of the substrate to coat the surface with silica when the soda glass is used.

The luminous colors may be adjusted by disposing a color filter film or a color conversion film, or a dielectric reflection film on the substrate.

The process for manufacturing the organic electroluminescence display shown in FIG. 9 is described hereinafter with reference to FIGS. 10(a)–11(e).

The silicon layer 241 is formed at first on the substrate 2. A protective under layer 281 including the silicon oxide layer with a thickness of 200 to 500 nm is formed on the surface of the substrate 2 with the plasma CVD method using TEOS (tetraethoxy silane) and oxygen gas as starting materials as shown in FIG. 10(a) to form the silicon layer 241.

Then, as shown in FIG. 10(b), the temperature of the substrate 2 is adjusted to 350° C., and a semiconductor layer 241A with a thickness of 30 to 70 nm including an amorphous silicon layer is formed on the surface of the protective underlayer 281 by the plasma CVD or ICVD method. Subsequently, the semiconductor layer 241A is converted into a polysilicon layer by a crystallization step of the semiconductor layer 241A by a laser anneal method, rapid heating method or solid phase growth method. A line beam with a longitudinal beam length of 400 mm from an eximer laser is used for the laser annealing method, and the output power thereof is adjusted to, for example, 200 mJ/cm². The line beam is scanned so that the portion having a laser intensity corresponding to 90% of the laser intensity in the transverse direction overlaps in each scanning region.

Subsequently, the semiconductor layer (polysilicon layer) 241A is patterned into islets of the silicon layer 241 as shown in FIG. 10(c), and a gate insulation layer 282 including a silicon oxide layer or silicon nitride layer with a thickness of 60 to 150 nm is formed on the surface of the islets of the silicon layer by the plasma CVD method using TEOS and an oxidative gas as starting materials. While the silicon layer 241 is destined to be the channel region and source-drain region of the second thin film transistor 24 shown in FIG. 7, the semiconductor layer destined to be the channel region and source-drain region of the first thin film transistor 22 is also formed at a different cross-sectional position. This means that, while the two kinds of transistors 22 and 24 are simultaneously formed, only the second thin film transistor 24 is described in the description hereinafter since both transistors are formed by the same procedure, and descriptions on the first transistor 22 are omitted.

The gate insulation layer 282 may be a porous silicon oxide layer ($SiO_2$) layer. The gate insulation layer 282 including the porous $SiO_2$ layer is formed by the CVD method (chemical vapor deposition method) using $Si_2H_6$ and $O_3$ as reaction gases. Large particles of $SiO_2$ are formed in the gas phase by using these reaction gases, and these large $SiO_2$ particles deposit on the silicon layer 241 and protective underlayer 281. The gate insulation layer 282 becomes porous having many voids in the layer, and the porous gate insulation 282 has a small dielectric constant.

The surface of the gate insulation layer 282 may be treated with a H (hydrogen) plasma, by which dangling bonds in Si—O bonds on the surface of the void are replaced with a Si—H bonds to improve moisture resistance of the layer. Another $SiO_2$ layer may be provided on the surface of the gate insulation layer 282 treated with the plasma.

The reaction gases available for forming the gate insulation layer 282 by the CVD method include $Si_2H_6+O_2$, $Si_3O_8+O_3$ and $Si_3H_8+O_2$ other than $Si_2H_6+O_3$. A reaction gas containing B (boron) or F (fluorine) may be used in addition to the gases above.

The porous gate insulation layer 282 with a stable layer quality may be formed by laminating a porous $SiO_2$ layer and a $SiO_2$ layer formed by the related art reduced pressure chemical vapor deposition method in forming the porous gate insulation layer 282. Lamination of these layers is enabled by intermittently or periodically generating a plasma in an atmosphere including $SiH_4$ and $O_2$ in a reduced pressure. Practically, the gate insulation layer 282 is formed by the steps of placing the substrate 2 in a chamber, keeping the temperature of the chamber at 400° C., and applying an RF voltage (a high frequency voltage) to the chamber using $SiH_4$ and $O_2$ as the reaction gas. The flow rates of $SiH_4$ and $O_2$ are kept constant, and the RF voltage is applied to a chamber with a cycle of 10 seconds during layer deposition. The plasma is generated and extinguished with a period of 10 seconds. A process suing the reduced pressure CVD and reduced pressure plasma CVD can be repeated in one chamber using the time-dependent plasma as described above. The $SiO_2$ layer having many voids in the layer can be formed by repeatedly applying the reduced pressure CVD and reduced pressure plasma CVD. As a result, the gate insulation layer becomes porous.

The gate electrode 242 is formed by forming a conductive layer including a metal, such as aluminum, tantalum, molybdenum, titanium and tungsten on the gate insulation layer 282 as shown in FIG. 10(d) followed by patterning.

Then, phosphorous ions are bombed in high concentration into the patterned gate electrode to form a source region 241s and drain region 241d on the silicon layer 241 in a self-matching manner with the gate electrode 242. The gate electrode 242 is used as a patterning mask. The portion where no impurities are introduced serves as a channel region 241c.

As shown in FIG. 10(e), the first interlayer insulation layer 283 is formed in the next step. The first insulation layer 283 includes a silicon oxide or nitride layer and a porous silicon oxide layer as in the gate insulation layer 282, and is formed on the gate insulation layer 282 by the same deposition method as forming the gate insulation layer 282.

Subsequently, contact holes corresponding to the source electrode and drain electrode are formed by patterning with the photolithographic method through the first interlayer insulation layer 283 gate insulation layer 282. Then, after forming a conductive layer including a metal, such as aluminum, chromium and tantalum so as to cover the first interlayer insulation layer 283, a patterning mask is provided on the conductive layer so as to cover the region where the source electrode and drain electrode are formed, and the source electrode 243 and drain electrode 244 are formed by patterning the conductive layer.

Subsequently, the signal lines, common power lines and scanning lines are formed on the first interlayer insertion layer 283 (not shown). Since the portion surrounded by these lines are destined to be a pixel in which the luminous layer to be formed, the lines are preferably formed so that the TFT 24 does not extend just under the portion surrounded by the lines when the element is a back emission type.

Subsequently, the second interlayer insulation layer 284 is formed so as to cover the first interlayer insulation layer 283, the electrodes 243 and 244, and each wiring line (not shown) as shown in FIG. 11(a).

The second interlayer insulation layer 284 includes the silicon oxide or nitride layer and porous silicon oxide layer as in the first interlayer insulation layer 283, and is formed on the surface of the first interlayer insulation layer 283 by the same layer deposition method as in forming the first interlayer insulation layer 283. After forming the second interlayer insulation layer 284, a contact hole 23a is formed at the portion corresponding to the drain electrode 244 on the second interlayer insulation layer 284. A conductive material, such as ITO, is patterned so as to be connected to the drain electrode 244 through the contact hole 23a to form the pixel electrode (positive electrode) 23.

The positive electrode 23 connected to the organic electroluminescence element includes a transparent electrode material, such as ITO, $SnO_2$ doped with fluorine, ZnO or polyamine, and is connected to the drain electrode 244 of the TFT 24 through the contact hole 23a. For forming the positive electrode, a layer including the transparent electrode material is formed on the second interlayer insulation layer 284, followed by patterning the layer.

After forming the positive electrode 23, an organic bank layer 221 is formed so as to cover a prescribed position of the second interlayer insulation layer 284 and a part of the positive electrode 23, as shown in FIG. 11(b). The third insulation layer (bank layer) 221 includes a synthetic resin such as an acrylic resin or a polyimide resin. The third insulation layer 221 is practically formed by applying a solution of a resist, such as the acrylic resin or polyimide resin, by spin-coating or dip-coating to form an insulation layer. However, any materials may be used for constructing the insulation layer, so long as they are not soluble in an ink solvent to be described hereinafter, and are ready to perform patterning by etching. The third insulation layer 221 provided with an aperture 221a is formed by forming the aperture 221a by simultaneous etching of the insulation layer by photolithography.

An ink-philic region and an ink-repelling region are formed on the surface of the third insulation layer 221. Each region is formed by a plasma processing in this embodiment. Practically, the plasma processing includes pre-heating, making the wall surface of the aperture 221a and electrode surface of the pixel electrode 23 ink-philic, making the surface of the third insulation layer 221 ink-repelling, and cooling.

The substrate (the substrate 2 including the third insulation layer) is heated at a prescribed temperature (for example about 70 to 80° C.), and is subjected to a plasma treatment ($O_2$ plasma treatment) as the making the substrate ink-philic under an atmospheric pressure using oxygen as a reaction gas. Subsequently, the substrate is subjected to a plasma treatment ($CF_4$ plasma treatment) as the making the substrate ink-repelling under an atmospheric pressure using tetrafluoromethane as a reaction gas. The substrate heated for plasma treatment is cooed to room temperature, thereby obtaining the substrate having desired ink-philic and ink-repelling portions. While the surface of the pixel electrode is also affected by the $CF_4$ treatment to a certain extent, the hydroxyl group introduced in the ink-philic step is not substituted with fluorine since ITO as the material of the pixel electrode 23 has low affinity to fluorine, and the surface of the pixel electrode is maintained to be ink-philic.

Subsequently, the positive hole transfer layer 70 is formed on the surface of the positive electrode 23, as shown in FIG. 11(c). The material to form the positive hole transfer layer 70 is not particularly restricted, and any materials in the related art may be used. Examples of the material include pyrazolin derivatives, arylamine derivatives, stilbene derivatives and triphenyl diamine derivatives. While these examples are described in Japanese Unexamined Patent Publication Nos. 63-70257, 63-175860, 2-135359, 2-135361, 2-209988, 3-37992 and 3-152184, the triphenyl diamine derivatives are preferable, and 4,4'-bis(N-(3-methylphenyl)-N-phenylamino)biphenyl is favorably used among them.

The positive hole injection layer may be formed in pace of the positive hole transfer layer, and the positive hole injection layer and positive layer transfer layer may be formed together. While examples of the material to form the positive layer injection layer include copper phthalocyanine (CuPc), polyphenylene vinylene as polytetrahydrothiophenyl phenylene, 1,1-bis(4-N,N-ditoylaminophenyl)cyclohexane and tris(8-hydroxyquinolynol)aluminum, copper phthalocyanine (CuPc) is particularly used. Polymer materials, such as polyethylene dioxythiophene or a mixture of polyethylene dioxythiophene and polystyrene sulfonic acid, are also available.

The ink-jet method is used to form the positive hole injection/transfer layer 70. The positive hole injection/transfer layer 70 is formed on the positive electrode 23 by discharging a composite ink containing the material to form the positive hole injection/transfer layer on the surface of the positive electrode 23, followed by drying and heat-treatment. The forming the positive hole injection/transfer layer and thereafter is preferably performed in an inert gas atmosphere, such as a nitrogen or argon atmosphere, in order to protect the positive hole injection/transfer layer 70 and luminous layer (organic electroluminescence layer) 60 from being oxidized. For example, the composite ink containing the material to form the positive hole injection/transfer layer is filled in an ink-jet head (not shown), discharge nozzles of the ink-jet head is allowed to face the surface of the positive electrode 23, and ink droplets with a controlled volume of one droplet are discharged from the discharge nozzles onto the surface of the electrode while allowing the ink-jet head to move relative to the base (substrate 2). Subsequently, the ink droplets after discharge are dried up by evaporating polar solvents contained in the composite ink, thereby forming the positive hole injection/transfer layer 70.

The composite ink available includes, for example, a mixture of a polythiophene derivative, such as polyethylene dioxythiophene and polystyrene sulfonic acid dissolved in a polar solvent, such as isopropyl alcohol. The ink droplets discharged are spread over the surface of the positive electrode 23 after the ink-philic treatment, and is filled in the vicinity of the bottom of the aperture 221a. The ink droplets do not adhere, on the other hand, on the surface of the third insulation layer 221 after the ink-repelling treatment. Accordingly, the surface is not wetted with the ink droplets even when the ink droplets are discharged on the surface of the third insulation layer 221 by hitting the surface out of the desired position, and the repelled ink droplets rolls down into the aperture 221a of the third insulation layer 221.

The positive hole transfer layer 70 formed by the ink-jet method on the surface of the positive electrode 23 is dried under the supercritical condition. The solvent (impurities) in the positive hole transfer layer 70 is sufficiently eliminated by supercritical drying. Since elimination of the solvent is possible at a relatively low temperature by using $CO_2$ as the supercritical fluid as described previously, chemical and physical properties of the positive hole transfer layer 70 are not largely changed. Since the volume is also suppressed from contracting when the solvent is evaporated off, a short circuit is prevented when an electric current is caused to flow.

Subsequently, the luminous layer 60 is formed on the surface of the positive hole injection/transfer layer 70, as shown in FIG. 11(d). The material to form the luminous layer 60 is not particularly restricted, and low molecular weight organic luminous pigments, and luminous polymer, or luminous substances comprising various fluorescent substances and luminescent substances are available. Conjugated polymers as the luminous substances preferably contain arylene-vinylene structures and polyolefin structures. Examples of the low molecular weight fluorescence substance include pigments such as naphthalene derivatives, anthracene derivatives, perylene derivatives, polymethine derivatives, xanthene derivatives, coumarin derivatives and cyanine derivatives, metal complexes of 8-hydroxyquinoline and its derivatives, aromatic amines, tetraphenyl cyclopentadiene derivatives, and compounds in the related art, such as those described in Japanese Unexamined patent Application Publication Nos. 57-51781 and 59-194393.

While polymers having fluorescent groups in the side chains are available when the fluorescent polymers are used as the material to form the luminous layer 60, they preferably have conjugated structures in the main chain, and polythiophene, poly-p-phenylene, polyarylene vinylene and polyfluorene, and their derivatives are particularly preferable. Polyarylene vinylene and its derivatives are preferable among them. The polyarylene vinylene and its derivatives is polymers containing 50 mol % or more of the repeating units represented by the chemical formula (1) in their total repeating units. It is more preferable that the repeating units represented by the chemical formula (1) account for 70 mol % or more of the total repeating units, although it depends on the structure of the repeating units.

$$—Ar—CR=CR'— \quad (1)$$

(where Ar represents an arylene or heterocyclic group with a carbon number of the group related to the conjugated bond of 4 or more and 20 or less, and R and R' each independently represents a group selected from the groups comprising an alkyl group with a carbon number of 1 to 20, an aryl group with a carbon number of 6 to 20, a heterocyclic group with a carbon number of 4 to 20, and a cyano group).

The fluorescent polymer may include aromatic groups or derivatives thereof, heterocyclic group or derivatives thereof and groups obtained as combinations thereof as the repeating unit other than the repeating unit represented by the chemical formula (1). The repeating unit represented by the chemical formula (1) and other repeating units may be linked by a non-conjugation unit comprising an ether group, ester group, amide group and imide group, or the non-conjugation group my include the non-conjugation group.

Ar in the chemical formula (1) in the fluorescent polymer is arylene or heterocyclic group with a carbon number related to the conjugated bond of 4 or more and 20 or less, and examples of it include an aromatic group or its derivative represented by the chemical formula (2), a heterocyclic group or its derivative, and a group obtained by a combination thereof.

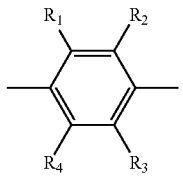
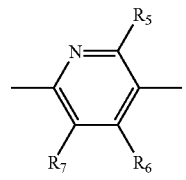
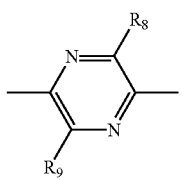
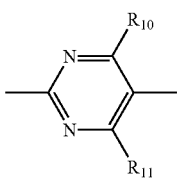
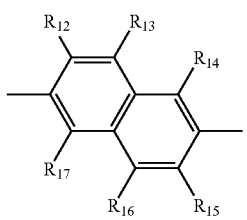
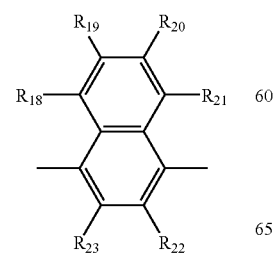

(2)

-continued

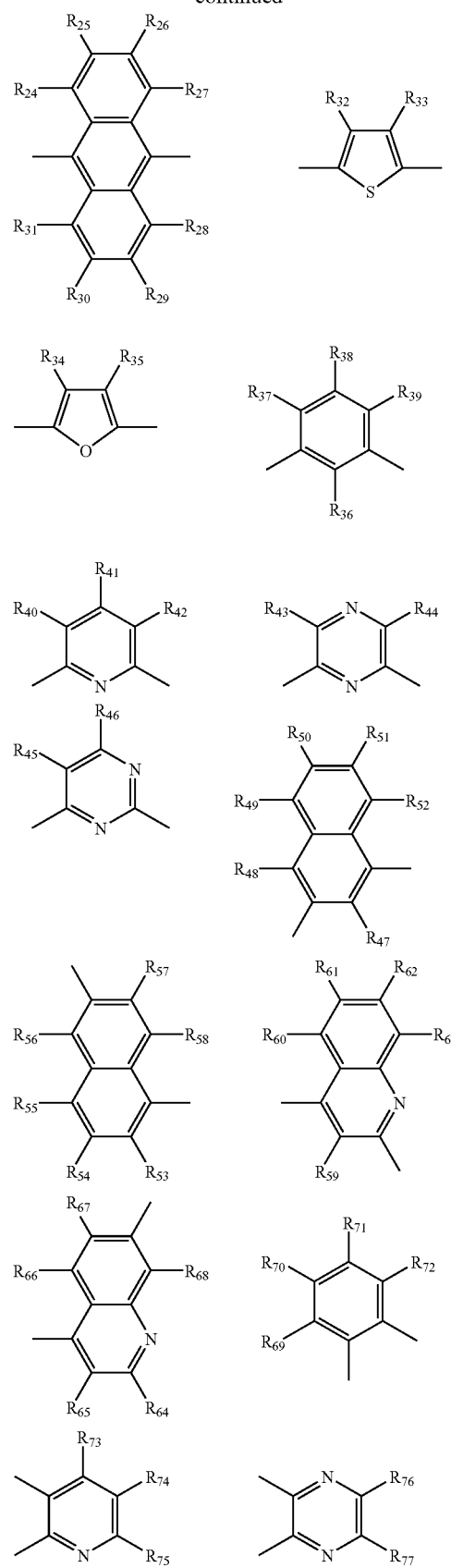

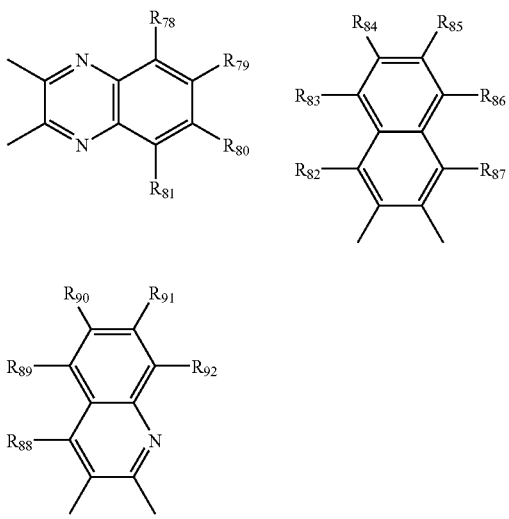

R1 to R92 each independently represents a group selected from hydrogen; an alkyl group, alkoxy group and alkylthio group with a carbon number of 1 to 20; an aryl and aryloxy group with a carbon number of 6 to 18; and a heterocyclic group with a carbon number of 4 to 14.

Preferable groups among these groups are phenylene group, substituted phenylene group, biphenylene group, substituted biphenylene group, naphthalene-diil group, substituted naphthalene-diil group, anthracene-9,10-diil group, substituted anthracene-9.10-diil group, pyridine-2,5-diil group, substituted pyridine-2,5-diil group, and thienylene group and substituted thienylene group. More preferable groups are phenylene group, biphenylene group, naphthalene-diil group, pyridine-2,5-diil group and thienylene group.

When R and R' in the chemical formula (1) are hydrogen or substituents other than the cyano group, examples of the alkyl group with a carbon number of 1 to 20 include methyl group, ethyl group, propyl group, butyl group, pentyl group, hexyl group, heptyl group, octyl group, decyl group and lauryl group, and methyl group, ethyl group, pentyl group, hexyl group, heptyl group and octyl group are preferable. Examples of the aryl group include phenyl group, 4-C1 to C12 alkoxyphenyl groups (C1 to C12 denote that the carbon number is 1 to 12 herein and hereafter), 4-C1 to C12 alkylphenyl group, 1-naphthyl group and 2-naphthyl group.

It is preferable considering solubility in solvents that Ar in the chemical formula (1) includes a group selected from at least one of alkyl group, alkoxy group and alkylthio group with a carbon number of 4 to 20, aryl group and aryloxy group with a carbon number of 6 to 18, and heterocyclic group with a carbon number of 4 to 14.

Examples of these substituents are as follows: alkyl group with a carbon number of 4 to 20 such as butyl group, pentyl group, hexyl group, heptyl group, octyl group, decyl group, and lauryl group, preferably pentyl group, hexyl group, heptyl group and octyl group; alkoxy group with a carbon number of 4 to 20, such as butoxy group, pentyloxy group, hexyloxy group, heptyloxy group, octyloxy group, decyloxy group and lauryloxy group, preferably pentyloxy group, hexyloxy group, heptyloxy group and octyloxy group; alkylthio group with a carbon number of 4 to 20 such as butylthio group, pentylthio group, hexylthio group, heptylthio group, octylthio group, decylthio group and laurylthio group, preferably pentylthio group, hexylthio group, heptylthio group and octylthio group; aryl group such as phenyl group and 4-C1 to C12 alkoxyphenyl group, 4-C1 to C12 alkylphenyl group, 1-naphthyl group and 2-naphthyl group; aryloxy group, such as phenoxy group; and heterocyclic group, such as 2-thyenyl group, 2-pyroryl group, 2-furyl group and 2-, 3- or 4-pyridyl group. While the number of these substituents differs depending on the molecular weight and constitution of the repeating units of the fluorescent polymer, the number of these substituents is at least one per molecular weight of 600 to obtain the fluorescent polymer having high solubility.

The fluorescent polymer may be a random, block or graft copolymer or a polymer having an intermediate structure thereof, for example a partially blocked random copolymer. The partially blocked random copolymer, or the block or graft copolymer is more preferable than the perfectly random copolymer for the purpose of obtaining a fluorescent polymer with high quantum yield of fluorescence. Since the organic electroluminescence element to be formed in the present invention takes advantage of fluorescence emitted from a thin film, the fluorescent polymer used emits a fluorescence light in a solid state.

Examples of the solvents favorably used for the fluorescent polymer include chloroform, methylene chloride, dichloroethane, tetrahydrofuran, toluene and xylene. The polymer can be usually dissolved in these solvents in a concentration of 0.1 wt % or more, although the solubility depends on the structure and molecular weight of the fluorescent polymer.

While the fluorescent polymer preferably has a molecular weight of $10^3$ to $10^7$ as converted into the molecular weight of polystyrene, it is varied depending on the structure of the repeating unit and the proportion thereof The number of the repeating unit is preferably in the range of 4 to 10,000, more preferably 5 to 3,000, and particularly 10 to 2,000 considering film forming ability.

While the method to synthesize the fluorescent polymer is not particularly restricted, an example of the method is an Wittig reaction using a diphosphonium salt obtained from a compound including an arylene group with two substituted methyl groups and triphenylphosphine. Another synthetic method is a dehalogenation hydrogenation method from a compound including the arylene group with two substituted halogenated methyl groups. The other method is a sulfonium salt decomposition method by which the fluorescent polymer is obtained by heat treating an intermediate compound obtained by alkali polymerization of a sulfonium salt of a compound including arylene group with two substituted halogenated methyl groups. Since the structure of the repeating unit in the fluorescent polymer formed may be changed by adding a compound having a frame structure other than the arylene group with different mixing ratio thereof, the proportion of the compound added may be controlled so that the repeating unit represented by the chemical formula (1) accounts for 50 mol % or more for copolymerization. The method based on the Wittig reaction is preferable among these methods from the view point of control of the reaction and production yield.

The method to synthesize the arylene vinylene based copolymer as one example of the fluorescent polymer will be described in detail hereinafter. To obtain the fluorescent polymer by the Wittig reaction, a bis(halogenated methyl) compound, for example 2,5-dioctyloxy-p-xylylene dibromide, is allowed to react with triphenylphosphine to obtain a phosphonium salt, which is condensed with a dialdehyde compound, for example terephthal aldehyde, in ethyl alcohol using lithium ethoxide, thereby obtaining a fluorescent polymer including a phenylene group and 2,5-dioctyloxy-p-phenylene vinylene. Two kinds or more of the diphosphonium salts and/or two kinds or more of the dialdehyde compounds may be allowed to react for obtaining a copolymer.

When these fluorescent polymers are used for the material to form the luminous layer, the polymers are desirably purified by re-precipitation and fractionation by chromatography after the synthesis since the purity of the polymer may affect luminous characteristics.

Materials to form red, green and blue luminous layers are used as the materials to form the luminous layer including the fluorescent polymers for full color display, and each material is injected onto a prescribed pixel AR using respective patterning apparatus (ink-jet apparatus).

A guest material may be added in a host material to form the luminous substance.

An organic polymer or low molecular weight material is favorably used as the host material, and a material including a fluorescent pigment or luminescent substance to change luminous characteristics of the luminous layer obtained is favorably used as the guest material.

In some of the organic polymers, the luminous layer that serves as the organic electroluminescence layer of the conjugated polymer is formed by heat-curing as shown in the chemical formula (3) after applying a precursor when the solubility of the material is low. In the case of the sulfonium salt of the precursor, for example, the sulfonium group is eliminated by heat-treating to form the conjugated organic polymer.

When the solubility of the material is high, on the other hand, the luminous layer is obtained by removing the solvent after the material has been directly allied.

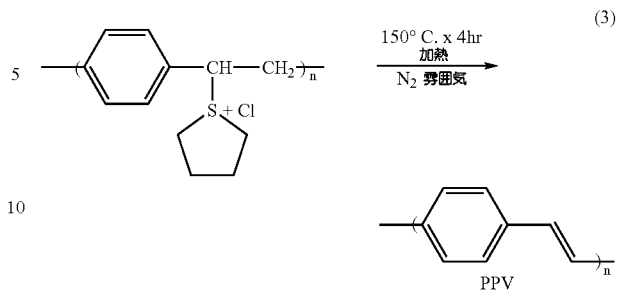

The organic polymer described above exhibits strong fluorescence in a solid state while forming a uniform and ultra-thin solid film. In addition, the polymer has a high film forming ability with high adhesive property to the ITO electrode while forming a tight conjugated polymer layer after solidification.

For example, polyarylene vinylene is preferable as the organic polymer. Polyarylene vinylene is soluble in aqueous solvents or organic solvents that renders it ready for preparing an application fluid for applying on the second substrate 11. In addition, an optically high quality of thin layer may be obtained by polymerizing under a given condition.

Preferable examples of such polyarylene vinylene include PPV derivatives, such as PPV (poly(paraphenylene vinylene)), MO-PPV (poly(2.5-dimethoxy-1,4-penylenevinylene)), CN-PPV (poly(2,5-bishexyloxy-1,4-penylene-(1-cyanovinylene))), MEH-PPV (poly[2-methoxy-5-(2'-ethylhexyloxy)]-paraphenylene vinylene), poly(alkylthiophene), such as PTV (poly(2,5-thianylene vinylene)), PFV (poly(2,5-furylene vinylene), poly(paraphenylene) and polyalkylfluorene. Those including PPV or precursors of PPV as shown in the chemical formula (4), and polyalkyl olefin as shown in the chemical formula (5) (particularly polyalkyl olefin copolymer as shown in the chemical formula (6)) are particularly preferable.

PPV as a conductive polymer having strong fluorescence with double bond forming π-electrons non-localized on the polymer chain is able to afford a high performance organic electroluminescence element.

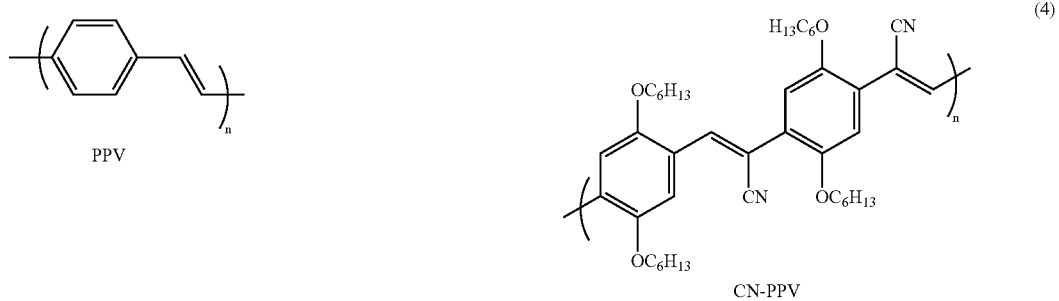

-continued
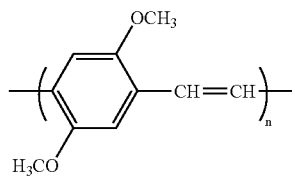
MO-PPV
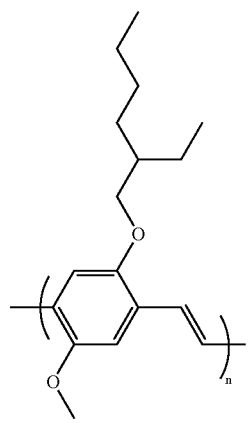
MEH-PPV
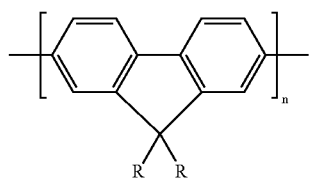
PAF
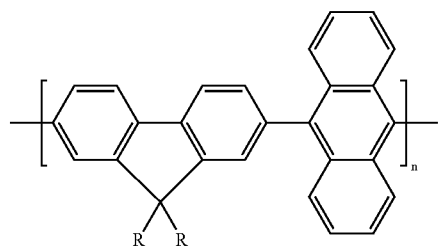
(5)
PAF-copolymer
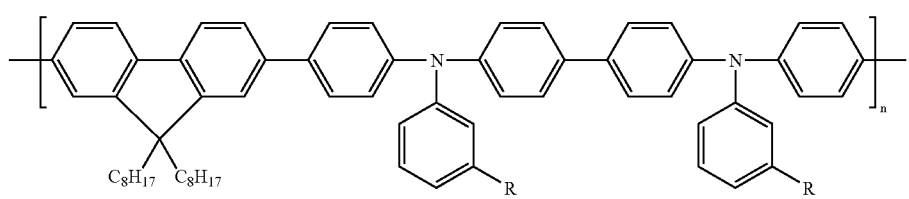
(6)
blue
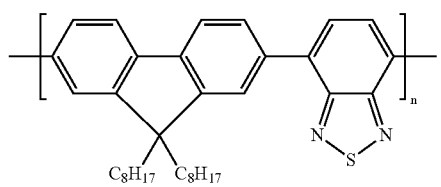
green
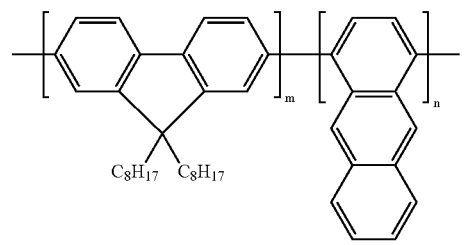
blue

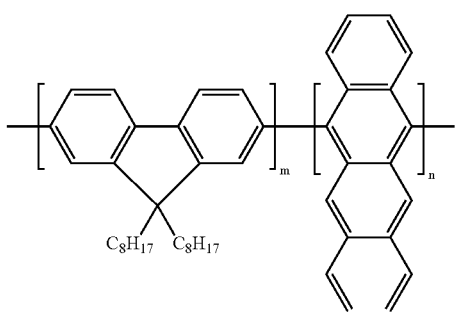

green

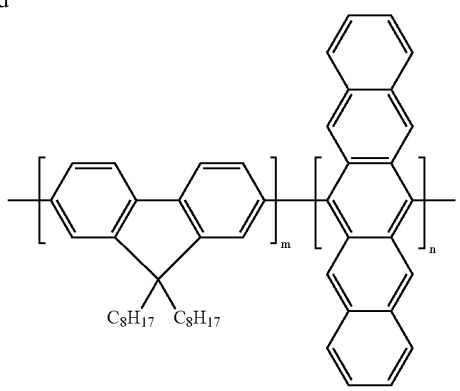

red
POLYFLUORENE BASED COPOLYMER

Examples of the organic polymer materials and low molecular weight materials that can form the luminous layer except the PPV thin layer, or the material to be used as the host material in this embodiment, include related art materials, such as quinolinol complexes of aluminum ($Alq_3$), distyryl biphenyl, $BeBq_2$ and $Zn(OXZ)_1$ represented by the chemical formula (7), and TPD, ALO and DPVBi, as well as a pyrazolin dimer, quinolidine carboxylic acid, benzopyrrilium perchlorate, benzopyrano quinolidine, rublene and phenanthroline europium complex. At least one of these materials may be used for the composition of the organic electroluminescence element.

(7)

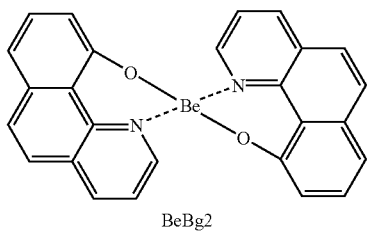

BeBq2

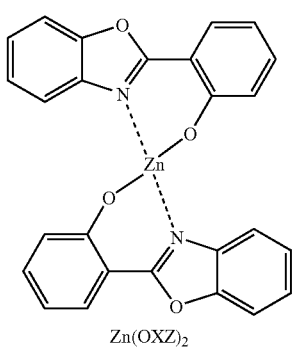

Zn(OXZ)2

Examples of the guest materials to be added to the host materials include the fluorescent pigments and luminescent materials as described above. The fluorescent pigment is particularly effective to enhance the luminous efficiency of the luminous layer and to change the light absorption maximum wavelength (emitted color). In other words, the fluorescent pigment may be used not only as a luminous layer material, but also as a pigment material responsible for the light emitting mechanism itself. For example, the energy of excitons generated by recombination of carriers on the conjugated organic polymer can be transferred to the fluorescent pigment molecules. Since the fluorescence light is emitted from only the fluorescent pigment molecules having high fluorescence quantum efficiency, quantum efficiency of the electric current in the luminous layer also increases. Accordingly, the emission spectrum of the luminous layer is determined by the emission spectrum of the fluorescence molecules by adding the fluorescent pigment in the luminous layer, which is effective for changing the emitted color.

The quantum efficiency of the electric current as used herein is a measure to elucidate luminous performance based on the light emission function, and is defined by the following equation:

$\eta E$=(energy of emitted photon)/(input electrical energy)

Three primary colors of red, blue and green may be emitted by changing the light absorption maximum wavelength by doping the fluorescent pigment, enabling a full color display to be obtained.

Doping the fluorescent pigment also permits the luminous efficiency of the electroluminescence element to be largely enhanced.

A laser pigment DCM-1, rhodamine or rhodamine derivative, or penylene is preferably used as the fluorescent pigment to form the luminous layer emitting a red light. The luminous layer may be formed by doping these fluorescent pigments in the host material. However, since most of these fluorescent pigments are water soluble, they are doped in a sulfonium salt as a precursor of water soluble PPV followed by a heat treatment, thereby enabling a uniform luminous layer to be formed. Examples of such fluorescent pigments include rhodamine B, rhodamine B base, rhodamine 6G and rhodamine 101 perchloric acid salt, and at least two of them may be mixed for use.

Quinacridon, rublene, and DCJT and its derivative are preferably used to form a luminous layer emitting the green light. These fluorescent pigments may be also doped in the host material, such as PPV, to from the luminous layer as using the fluorescent pigment described above. However, since most of these fluorescent pigments are water soluble, they are doped in a sulfonium salt as a precursor of water soluble PPV followed by a heat treatment to form uniform luminous layer to be formed.

Distyryl biphenyl and derivatives thereof are preferably used to form a luminous layer emitting the blue light. These fluorescent pigments may be also doped in the host material, such as PPV, to from the luminous layer as using the fluorescent pigment described above. However, since most of these fluorescent pigments are water soluble, they are doped in a sulfonium salt as a precursor of water soluble PPV followed by a heat treatment to form uniform luminous layer to be formed.

Examples of other fluorescent pigments emitting the blue light include coumarin and its derivative. These fluorescent pigments has good compatibility with PPV and ready for forming the luminous layer. While coumarin is particularly insoluble in solvents, its solubility may be increased by appropriately selecting substituents to allow it to be dissolved in the solvents. Examples of such pigment include coumarin-1, coumarin-6, coumarin-7, coumarin 120, coumarin 138, coumarin 152, coumarin 153, coumarin 211, coumarin 314, coumarin 334, coumarin 337 and coumarin 343.

Examples of other fluorescent pigment emitting a different blue color include tetraphenyl butadiene (TPB) or derivatives thereof, and DPVBi. These fluorescent pigments are soluble in water as the red fluorescent pigments, and have good compatibility with PPV to facilitate formation of the luminous layer.

One kind each of the fluorescent pigments as described above may be used for each color, or a mixture of at least two of them may be used.

The fluorescent pigments used include those represented by the chemical formulae (8), (9) and (10).

(8)

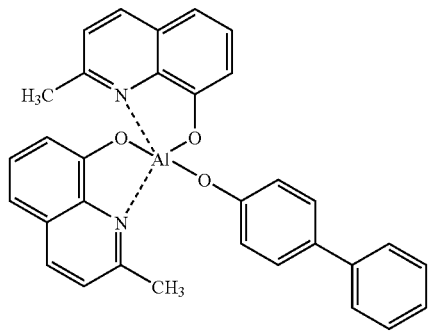

BALQ

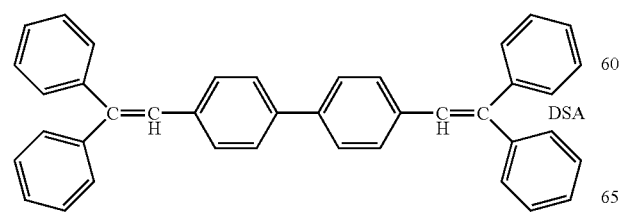

DSA (9)

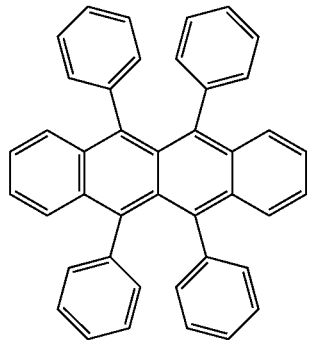

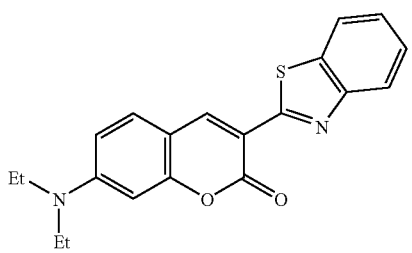

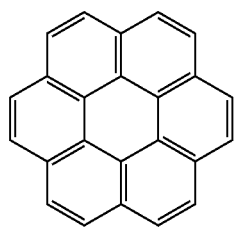

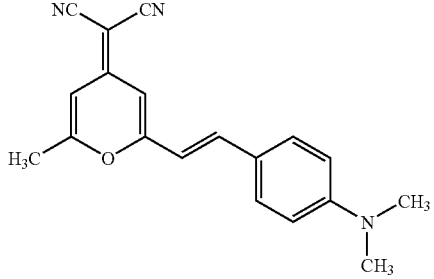

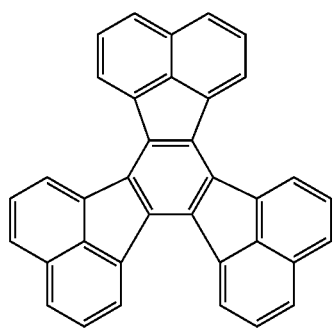

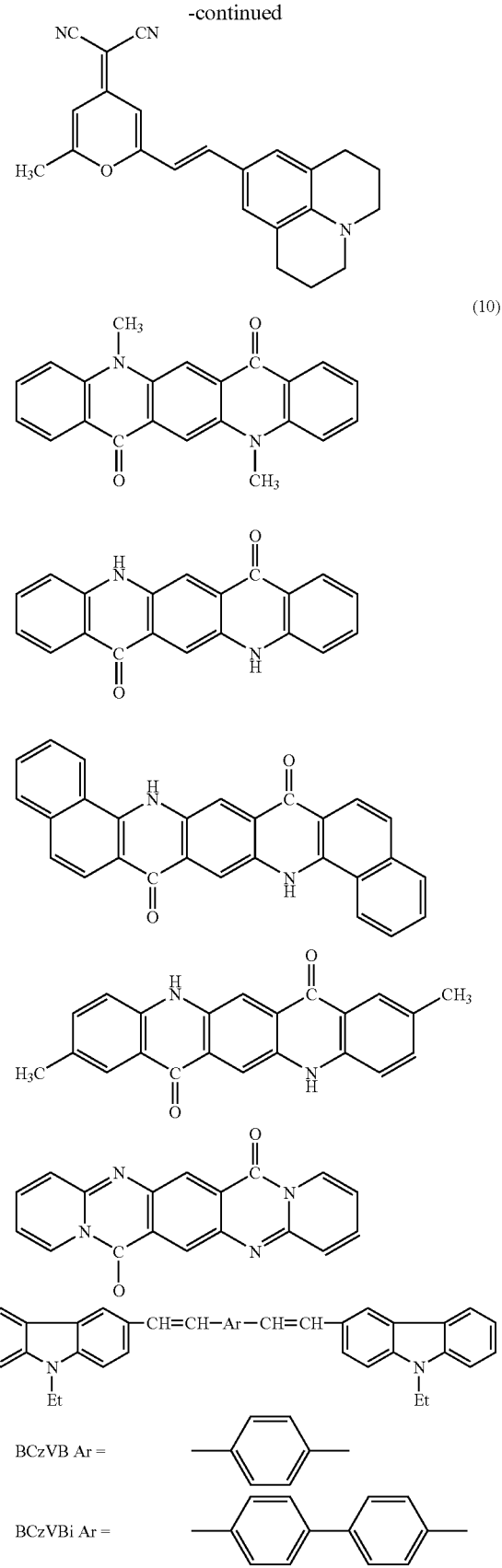

These fluorescent pigments is preferably added in a proportion of 0.5 to 10 wt %, more preferably 1.0 to 5 wt %, relative to the host material including the conjugated organic polymer by the method to be described hereinafter. The weatherability and durability of the luminous layer can be hardly maintained when the amount of addition of the fluorescent pigment is too large, while the effect of adding the fluorescent pigments cannot be fully manifested when the amount of addition is too small.

Examples of the luminescent substances as the guest materials to be added in the host material include Ir(ppy)$_3$, Pt(thpy)$_2$ and PtOEP represented by the chemical formula (11).

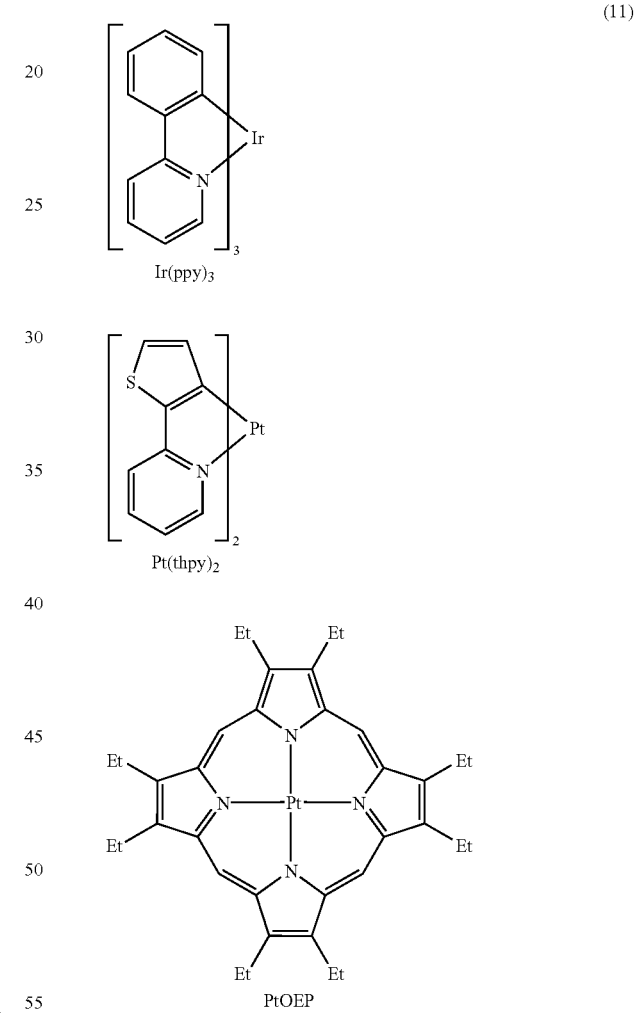

When the luminescence substances represented by the chemical formula (11) are used as the guest material, favorably used host materials include CBP, DCTA and TCBP represented by the chemical formula (12), and DPVBi and Alq$_3$ as described above.

The fluorescent pigment and luminescent substance mat be added into the host material together as the guest materials.

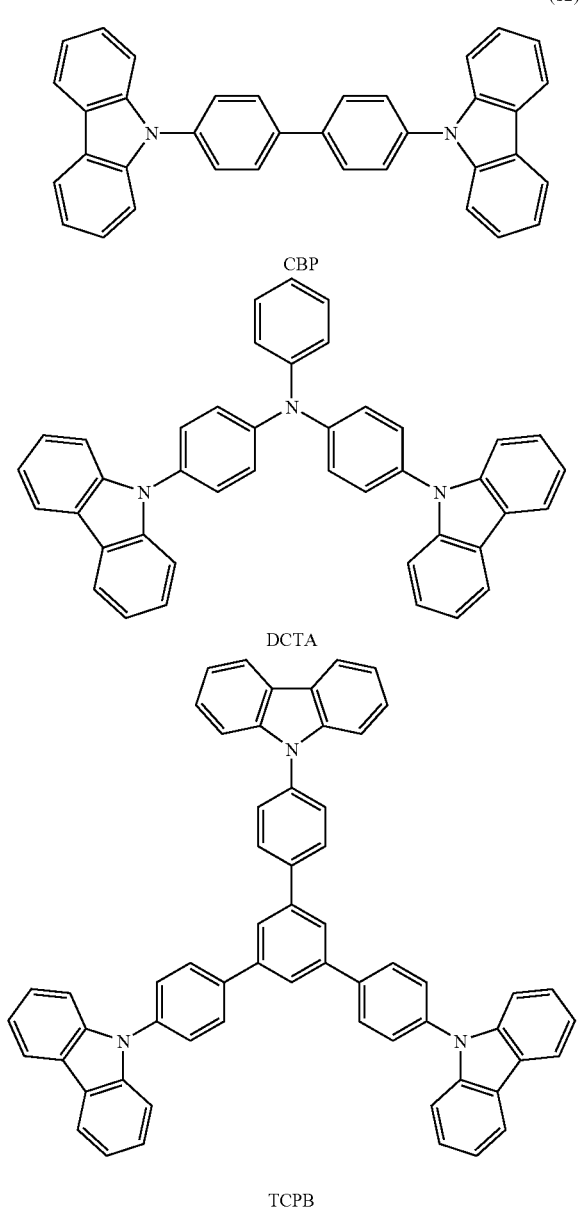

CBP

DCTA

TCPB

When the luminous layer 60 is formed with such host/guest system of the luminous substance, a plurality of material feed systems such as nozzles are previously provided in the patterning apparatus (an ink-jet apparatus), and the host materials and guest materials are simultaneously discharged in a predetermined weight ratio to form the luminous layer 60 with the luminous substance comprising a desired quantity of the guest material added in the host material.

The luminous layer 60 is formed by the same procedure as forming the positive hole injection/transfer layer 70. The composite ink containing the luminous layer material is discharged on the surface of the positive hole injection/transfer layer 70 by the ink-jet method followed by drying and heat-treatment, thereby forming the luminous layer 60 on the positive hole injection/transfer layer 70 within the aperture 221a formed on the third insulation layer 221. This forming the luminous layer is also performed in an inert gas atmosphere. Since the composite ink discharged is repelled in the ink-repelling treatment region, the repelled ink droplets roll into the aperture 221a of the third insulation layer 221 even when the ink droplets hit a position out of the predetermined ink discharge position.

The luminous layer 60 formed on the positive hole injection/transfer layer 70 by the ink-jet method is dried under a supercritical condition. Solvents (impurities) in the luminous layer 60 can be sufficiently removed by supercritical drying. Since the solvents are removed at a relatively low temperature as described previously using $CO_2$ as the critical fluid, chemical and physical properties of the luminous layer 60 are not largely changed. Short circuits are prevented from generating by flowing an electric current, since contraction of the volume is suppressed when the solvent is evaporated off.

Subsequently, the electron transfer layer 50 is formed on the surface of the luminous layer 60. The electron transfer layer 50 is also formed by the ink-jet method as in forming the luminous layer 60. The material to form the electron transfer later 50 is not particularly restricted, and examples of the material include oxadiazole derivatives, anthraquinone dimethane and derivatives thereof, benzoquinone and derivatives thereof, naphthoquinone and derivatives thereof, anthraquinone and derivatives thereof, tetracyano anthraquinone dimethane and derivatives thereof, fluorenone derivatives, diphenyldicyano ethylene and derivatives thereof, diphenoquinone derivatives, and 8-hydroxyquinoline and metal complexes of derivatives thereof. Examples of these materials are described, as the material to form the positive hole transfer layer, in Japanese Unexamined Patent Application Publication Nos. 63-70257, 63-175860, 2-135359, 2-135361, 2-209988, 3-37992 and 3-152184. Particularly, 2-(4-bipheny)-5-(4-t-butylphenyl)-1,3,4-oxadiazole, benzoquinone, anthraquinone and tris(8-quinolinol)aluminum are suitable.

The electron transfer layer 50 formed on the surface of the luminous layer 60 by the ink-jet method is dried under the supercritical condition. Solvents (impurities) in the electron transfer layer 50 can be sufficiently removed by supercritical drying. Since the solvents are removed at a relatively low temperature as described previously using $CO_2$ as the critical fluid, chemical and physical properties of the electron transfer layer 50 are not largely changed. Short circuits are prevented from being generated when an electric current is caused to flow, since contraction of the volume is suppressed when the solvent is evaporated off.

The material to form the positive hole injection/transfer layer 70, and the material to form the electron transfer layer 50 may be mixed with the material to form the luminous layer 60, and the mixed material may be used as the material to form the luminous layer. The amounts of use of materials to form the positive hole injection/transfer layer and electron transfer layer are appropriately determined considering the range not inhibiting sufficient film-forming ability and luminous characteristics, although the amounts differ depending on the kinds of the compounds used. The amount is usually in the range of 1 to 40% by weight, more preferably 2 to 30% by weight, relative to the amount of the material for forming the luminous layer.

Subsequently, the negative electrode 222 is formed on the surface of the electron transfer layer 50 and third insulation layer 221, as shown in FIG. 11(e). The negative electrode 222 is formed on the entire surface of the electron transfer layer 50 and third insulation layer 221, or in a striped shape. While the negative electrode 222 may be naturally formed as a monolayer including a single material, such as Al, Mg, Li and Ca and an alloy including Mg and Ag in 10:1 ratio, it may be formed as a bilayer or triple layer of metals (including alloys). Actually, a layer structure such as $Li_2O$ (about 0.5 nm)/Al or LiF (about 0.5 nm)/Al and MgF/Al is available. The negative electrode 222 is a light permeable thin film of the metals as described above.

The method for manufacturing the electro-optical device as described above can be applied for the top emission type organic electroluminescence display. Solvents as well as impurities may be sufficiently removed from these layers by drying the positive hole transfer layer 70, luminous layer 60 and electron transfer layer 50 formed by the ink-jet method under the supercritical condition. Accordingly, the service life of the device may be prolonged by preventing aging of the element, enabling desired luminous characteristics to be maintained.

While each of the positive hole injection/transfer layer 70, luminous layer 60 and electron transfer layer 50 is formed by the inkjet method in this embodiment, it is possible to form these layers by a vapor deposition method. Volatile components and impurities can be removed at a relatively low temperature by drying the layers under the supercritical condition without largely changing the chemical and physical properties of each layer.

A hole blocking layer may be formed at the opposed electrode 222 side of the luminous layer 60 in addition to the positive hole injection/transfer layer 70, luminous layer 60 and electron transfer layer 50, in order to prolong the service life of the luminous layer 60. While examples of the hole blocking layer include BCP represented by the chemical formula (13) and $BAl_q$ represented by the chemical formula (14), $BAl_q$ is preferable for the purpose of prolonging the service life.

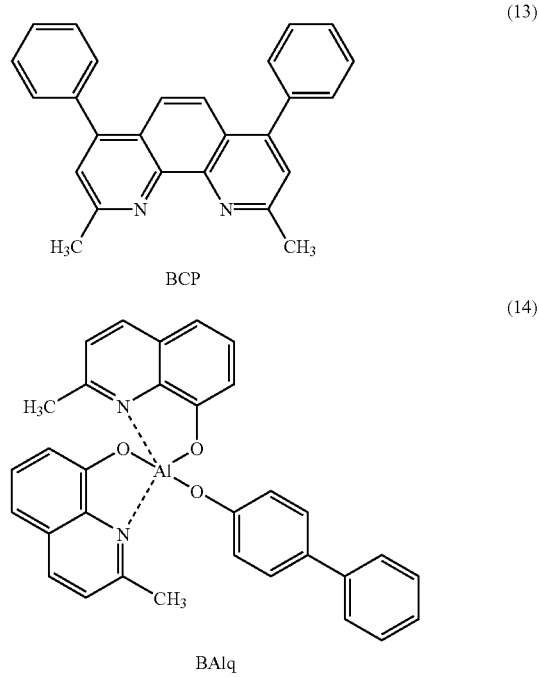

(13)

BCP (14)

BAlq

Figure 12:
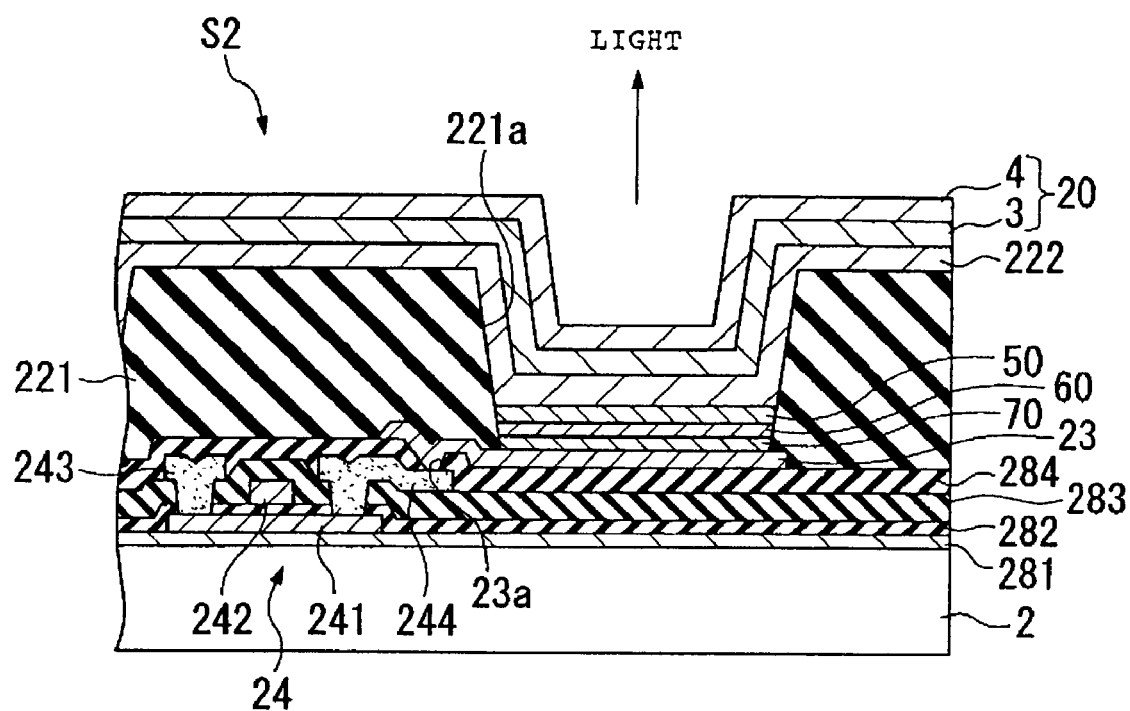
FIG. 12 is a cross-sectional view that shows another example of the layer structure of the organic electroluminescence display manufactured by the method for manufacturing the electro-optical device according to the present invention.

The low refractivity layer 3 and seal layer (barrier layer) 4 may be provided on the surface of the negative electrode 222 of the organic electroluminescence display S1 shown in FIG. 9, as in the top emission type organic electroluminescence display S2 shown in FIG. 12. Solvents (impurities) contained in the low refractivity layer 3 and seal layer 4 may be removed by supercritical drying. The materials and methods for forming the low refractive layer 3 and seal layer 4 are omitted herein since they are the same as those described using FIG. 1.

Figure 13:
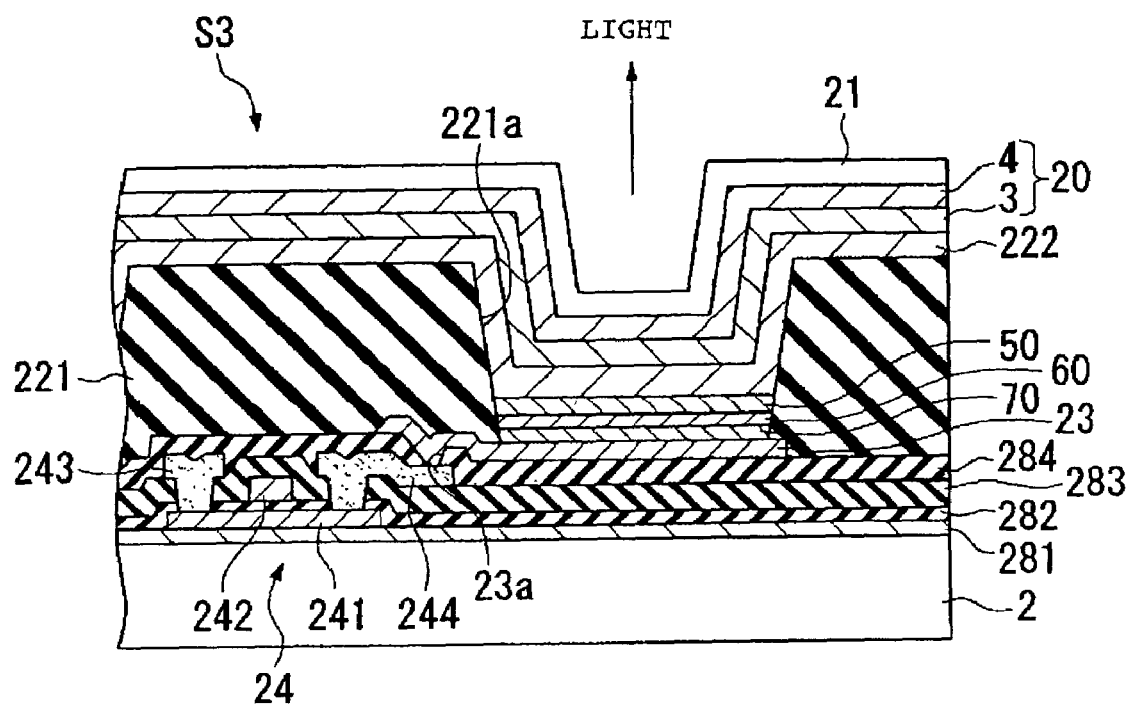
FIG. 13 is a cross-sectional view that shows the other example of the layer structure of the organic electroluminescence display manufactured by the method for manufacturing the electro-optical device according to the present invention.

A light permeable polymer layer (light transmission layer) 21 may be further formed on the surface of the laminated layer 20 including the low refractive layer 3 and seal layer 4, as in the top emission type organic electroluminescence display S3 shown in FIG. 13.

Figure 4:
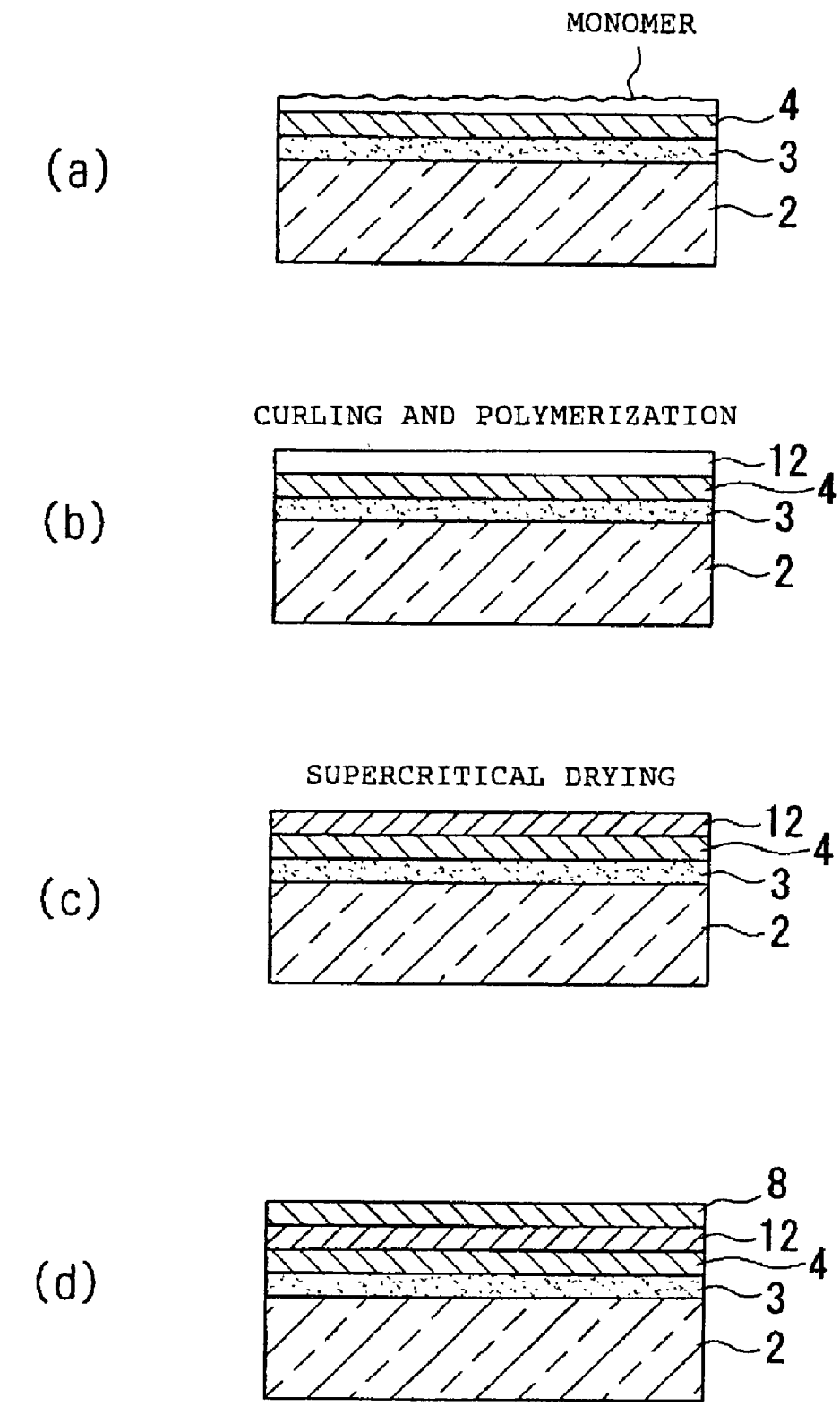
FIGS. 4(a) to 4(d) are cross-sectional views describing the method for manufacturing the electro-optical device according to the present invention.

The same material as use in the polymer layer 12 in FIG. 4 may be used for the polymer layer 21.

To form the polymer layer 21 on the surface of the seal layer 4, the monomer (or precursor) of the polymer is applied on the surface of the seal layer (barrier layer) 4. Since the monomer has high fluidity, it is planarized by coating on the surface of the seal layer 4, and the polymer layer 21 is formed by curing or polymerizing the applied monomer. The polymer layer 21 is planarized and structural defects of the seal layer 4 are reduced by forming the polymer layer 21 by curing or polymerization of the monomer after applying the highly fluid monomer. The seal layer 4 can exhibit a good barrier property by reducing the structural defects with the polymer layer 12. Impurities, such as the monomer (or precursor) and solvents remaining in the polymer layer 21, are sufficiently removed by drying the polymer layer 21 formed under the supercritical condition, enabling changes of the shape such as volume contraction to be suppressed to its minimum. In addition, a high void ratio may be maintained without collapse of the voids when the polymer layer 21 is porous, thereby ensuring high light emission efficiency.

Since defects in the seal layer 4, if any, may be amended by the polymer layer 21 by providing the polymer layer 21 on the surface of the seal layer 4 as described above, the barrier property of the seal layer 4 is enhanced. Impurities included in the polymer layer 21 can be sufficiently removed by drying the polymer layer 21 by supercritical drying.

Figure 14:
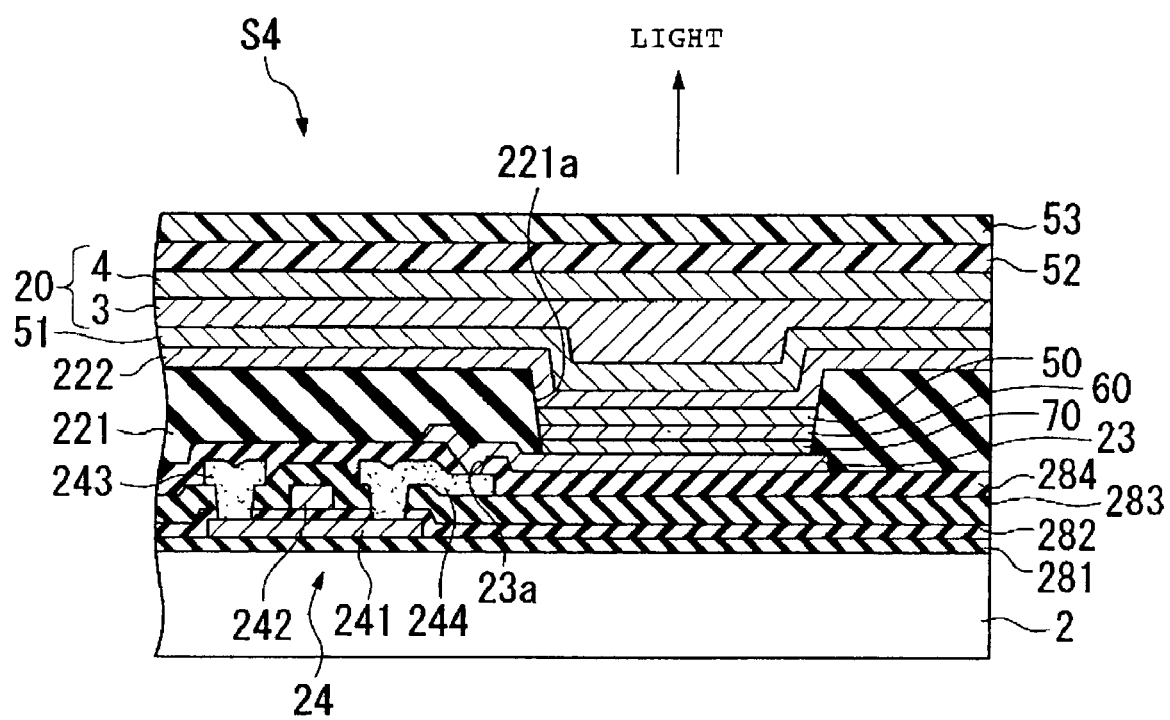
FIG. 14 is a cross-sectional view that shows a different example of the layer structure of the organic electroluminescence display manufactured by the method for manufacturing the electro-optical device according to the present invention.

The organic electroluminescence display may have the layer structure as shown in FIG. 14. The organic electroluminescence display S4 as shown in FIG. 14 includes a protective layer 51 formed on the surface of the negative electrode 222 to protect the negative electrode 222, a laminated film 20 including the low refractivity layer 3 and seal layer 4 formed on the surface of the protective layer 51, and a seal substrate 53 provided on the laminated layer 20 and adhered on the laminated layer 20 with interposition of an adhesive layer 52.

The protective layer 51 includes the same material as the seal layer 4, such as ceramics including silicon nitride, silicon oxide nitride and silicon oxide, and is formed on the surface of the negative electrode 222 by the plasma CVD method (plasma chemical vapor deposition method). The protective group 51 is light permeable and has a lower refractivity than the adhesive layer 52 and seal substrate 53.

The adhesive layer (light transmission layer) 52 includes a light permeable material, such as an epoxy resin and acrylic resin. A two liquid mixing type epoxy resin or UV curing type resin may be used for the adhesive resin. A heat curing type resin may be used when the organic electroluminescence element 9 is not supposed to be degraded by heating.

The seal substrate ( )light transmission layer) 53 has a barrier property, and includes a light permeable material. Examples of the material to form the seal substrate 53 include transparent materials, such as ceramics including silicon nitride, silicon oxide nitride and silicon oxide. Alternatively, a protective sheet including a prescribed synthetic resin may be used in place of the seal substrate 53 with the materials above.

A sufficient barrier effect may be obtained by providing the protective layer 51 to protect the negative electrode 222 while providing the seal substrate 53 to prevent a gas that causes deterioration of the element while protecting the entire display S3. The barrier effect may be attained only by bonding the seal substrate 53 and laminated layer 20 with interposition of the adhesive layer 52 without providing the protective layer 51.

The seal substrate 53 described with reference to FIG. 14 may provided on the surface of the polymer layer 21 described with reference to FIG. 13 with interposition of the adhesive layer 52.

Figure 15:
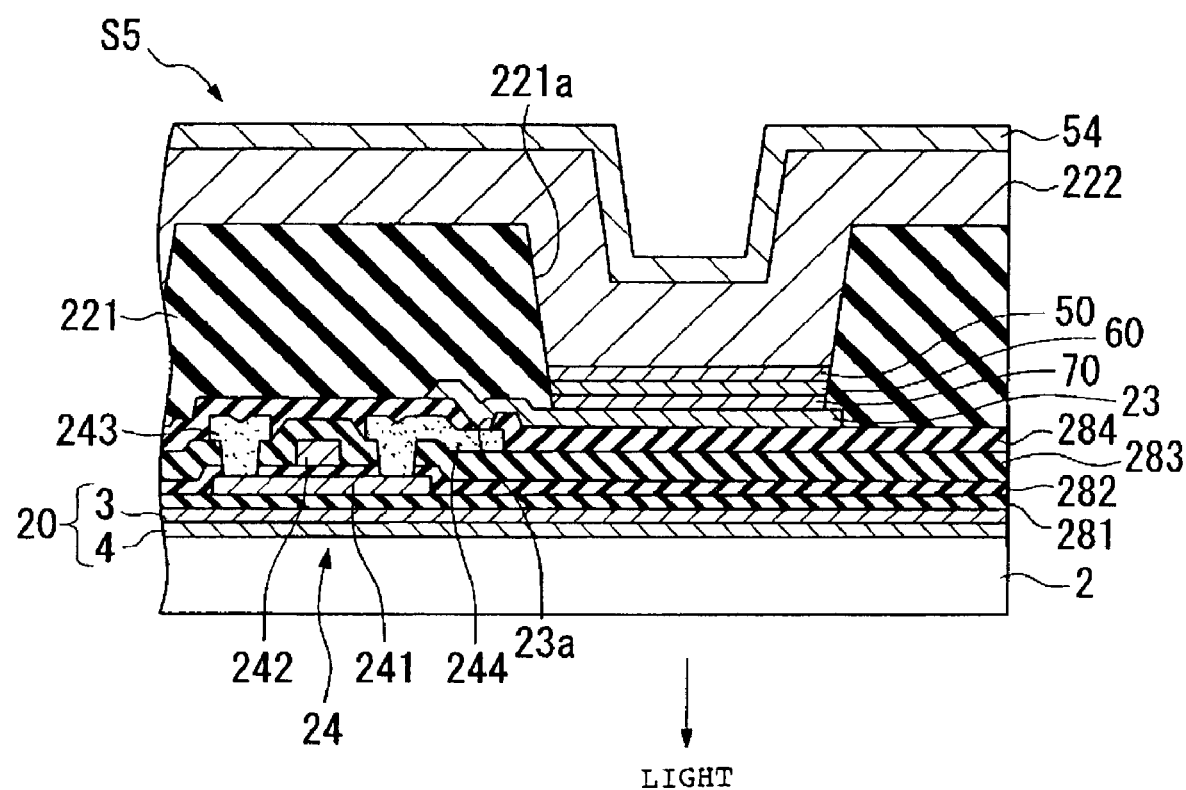
FIG. 15 is a cross-sectional view that shows a further different example of the layer structure of the organic electroluminescence display manufactured by the method for manufacturing the electro-optical device according to the present invention.

The organic electroluminescence display S5 shown in FIG. 15 is a so-called back emission type organic electroluminescence display, where the emitted light from the luminous layer 60 is projected out of the device from the substrate 2 side including the TFT 24.

The organic electroluminescence display S5 shown in FIG. 15 includes, as in the foregoing embodiments, a second interlayer insulation layer 284 provided as the lower of the positive electrode 23 of the organic electroluminescence element, the first interlayer insulation layer 283 provided as the lower layer of the second interlayer insulation layer 284, a gate insulation layer 282 provided as the lower layer of the first interlayer insulation layer 283, and a protective underlayer 281 provide as the lower layer of the gate insulation layer 282. A laminate layer 20 including the polymer layer (low refractivity layer) 3 and seal layer 4 is provided between the protective underlayer 281 and substrate 2.

Since the organic electroluminescence display S5 shown in FIG. 15 is a back emission type display, the substrate 2 includes a light permeable material, and a transparent or semi-transparent material, such as a glass and quartz crystal is used as the material to form the substrate 2. However, an inexpensive soda glass is preferably used.

A barrier layer 54 that prevents substances, ascribed to element deterioration (such as oxygen and moisture), from invading into the electroluminescence element is formed on the surface of the negative electrode 222. A metal film (metal substrate), resin film and ceramics, such as silicon nitride, silicon oxide nitride and silicon oxide that has a barrier function, may be sued for the barrier layer 54.

The second interlayer insulation layer 284, first interlayer insulation layer 283 and gate insulation layer 282 through which the emitted light from the luminous layer 60 passes through are made of light permeable materials.

The materials to form the insulation layers comprises a silicon oxide film, porous polymer and silica aerogel. The insulation layers may be formed by supercritical drying after depositing the material to form the insulation layer.

To form the laminated layer 20 on the substrate 2, the monomer (or precursor) that is destined to be the low refractivity later 3 in the polymer layer is applied on the seal layer 4 after forming the seal layer on the surface of the substrate 2, and the monomer is cured or polymerized followed by supercritical drying to form the low refractivity layer 3. Impurities, such as solvents, are removed from the low refractivity layer 3 by supercritical drying, and structural defects in the seal layer 4 is amended by the low refractivity layer 3 to enable high barrier property to be manifested. Furthermore, light emission efficiency is enhanced by forming the low refractivity layer 3.

A reflective layer that is able to reflect a light may be provided between the barrier layer 5 and negative electrode 222 in the organic electroluminescence display S5 shown in FIG. 15. Since the light emitted from the luminous layer 60 to the negative electrode 222 is reflected by the reflective layer and advances to the substrate 2 side by providing the reflective layer, light emission efficiency may be enhanced.

Figure 16:
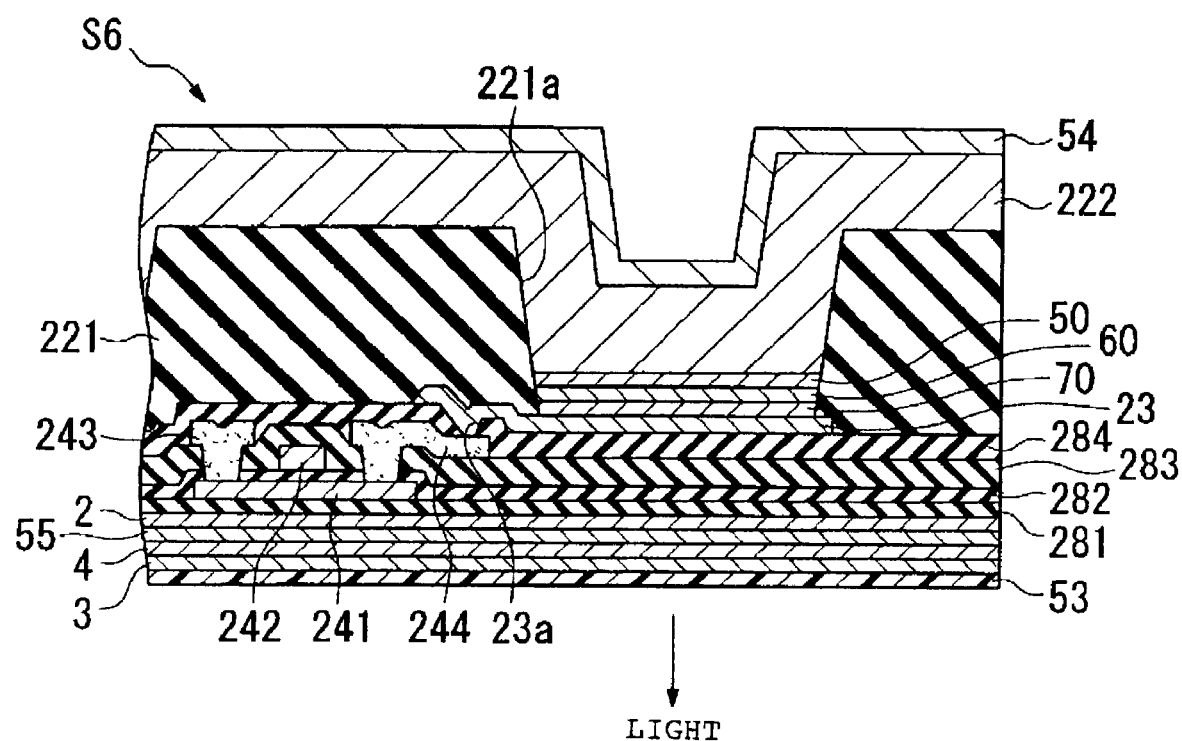
FIG. 16 is a cross-sectional view that shows a further different example of the layer structure of the organic electroluminescence display manufactured by the method for manufacturing the electro-optical device according to the present invention.

As shown in the back emission type organic electroluminescence display S6 in FIG. 16, the barrier layer 54 is provided at the uppermost layer while providing the light permeable substrate 2 under the protective underlayer 281, the polymer layer 55 under the substrate 2, the laminated layer 20 including the seal layer 4 and low refractivity layer 3 under the polymer layer 55, and the seal substrate 53 under the laminated layer 20.

The same material as used to form the polymer layer 21 described in FIG. 13 may be used for the material to form the polymer layer 55. Otherwise, the polymer layer 55 may be formed with the same material used for forming the low refractivity layer 3. Impurities contained in each layer may be sufficiently removed by supercritical drying of these layers.

The layer structures of the polymer layer, low refractivity layer and seal layer may be arbitrarily determined as described above to obtain a high barrier property.

Figure 17:
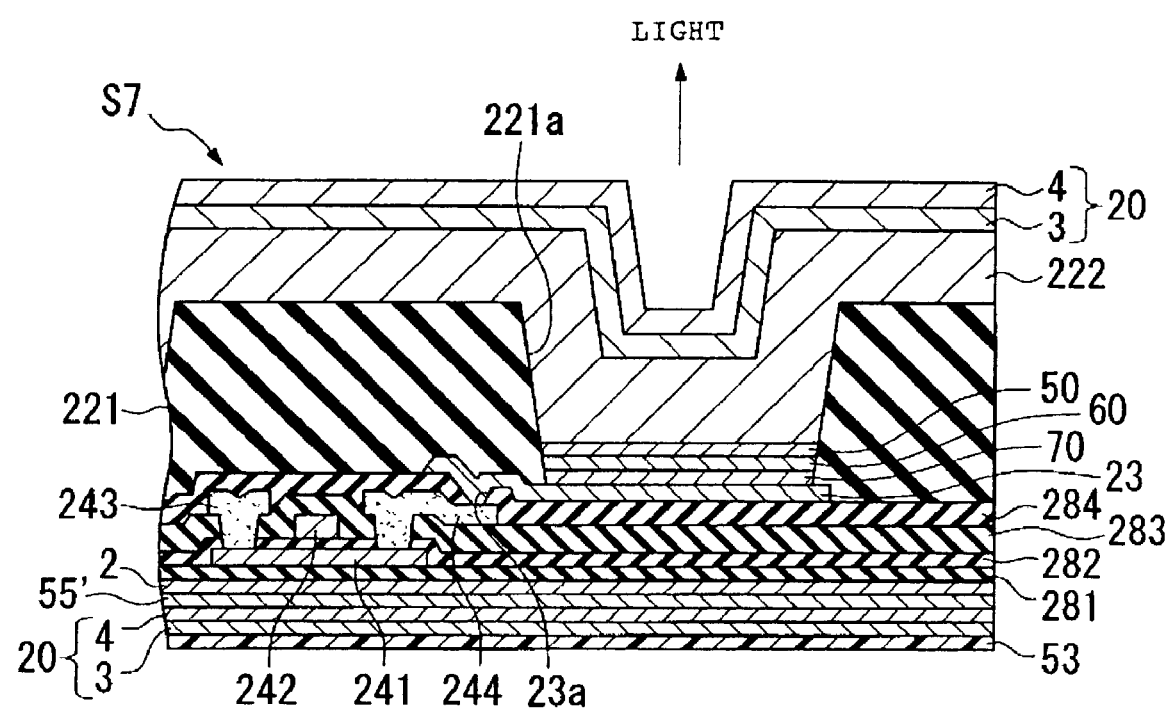
FIG. 17 is a cross-sectional view that shows a further different example of the layer structure of the organic electroluminescence display manufactured by the method for manufacturing the electro-optical device according to the present invention.

While FIG. 16 shows the back emission type electroluminescence display, it is needless to say that a variety of layer structures may be employed in the top emission type organic electroluminescence display S7 as shown in FIG. 17. These layer structured enable a high barrier property to be attained to enable the element from being deteriorated in the top emission type organic electroluminescence display. The laminated layer 20 including the low refractivity layer 3 and seal layer 4 is formed on the surface of the negative electrode 222 in this type display. However, the polymer layer 55' shown in FIG. 17 is not always required to have a low refractivity, and the layer may be constructed with a material having a high barrier property and capable of amending structural defects of the seal layer 4.

Figure 18:
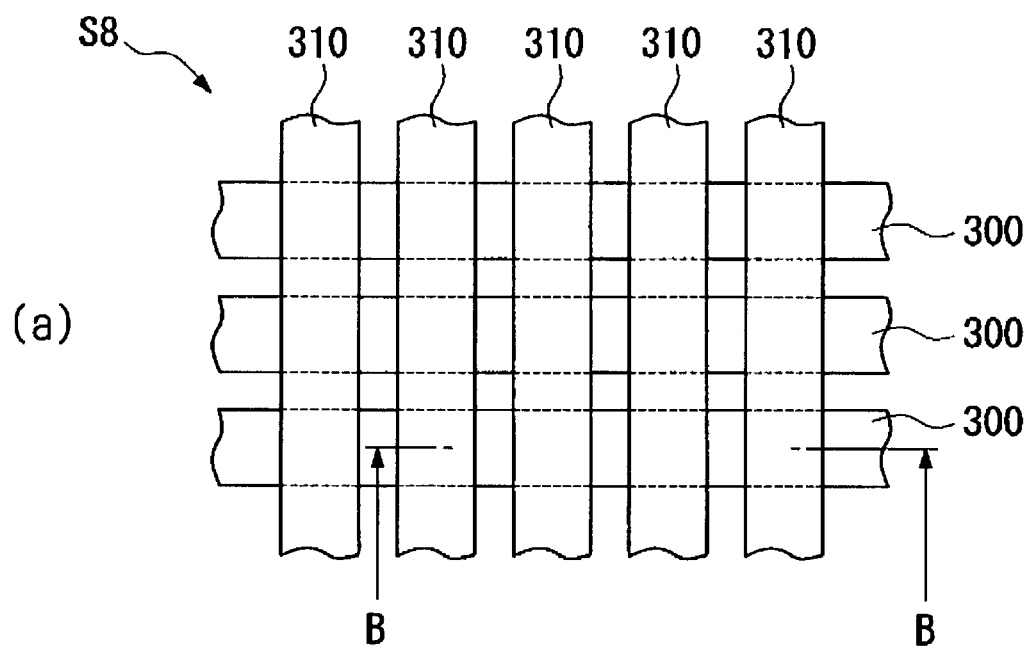
FIGS. 18(a) and 18(b) are schematics that show the passive matrix type organic electroluminescence display manufactured by the method for manufacturing the electro-optical device according to the present invention, where
Figure 18:
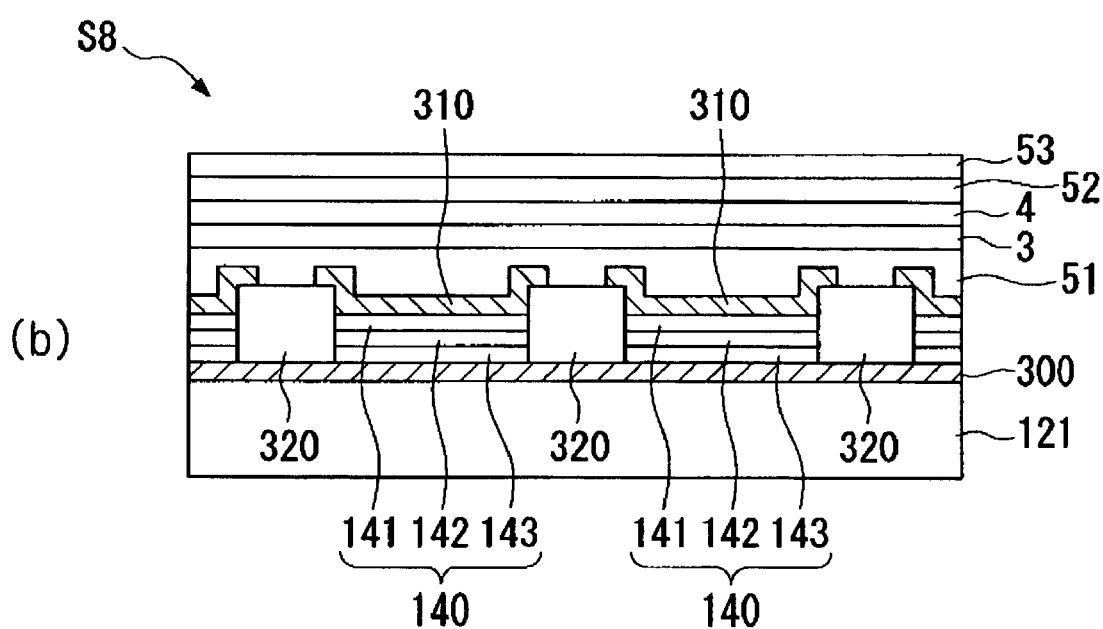

FIGS. 18(*a*) and 18(*b*) show a passive matrix type organic electroluminescence display S8, where FIG. 18(*a*) is a plan view, and FIG. 18(*b*) is a cross-sectional view taken along plane B—B.

The passive matrix type organic electroluminescence display S8 includes a plurality of bus wiring lines 300 provided on the substrate 121, and a plurality of bus wiring lines 310 provided in the direction perpendicular to the bus wiring lines above. The insulation layer 320 comprising $SiO_2$ is disposed so as to surround the position where a luminous element (organic electroluminescence element) 140 comprising the electron transfer layer 141, luminous layer 142 and positive hole transfer layer 143 is disposed.

A protective layer 51 to protect the bus wiring lines 310 is provided on the bus wiring lines 310, a seal layer 4 is provided on the surface of the protective layer 51, a polymer layer (low refractivity layer) 3 is provided on the surface of the seal layer 4, and a seal substrate 53 is provided on the surface of the polymer layer 3 with interposition of an adhesive layer 52.

To form the polymer layer 3, a monomer (or precursor) as a material to form the polymer layer 3 on the surface of the seal layer 4 is applied, and is cured or polymerized followed by supercritical drying. Naturally, the supercritical drying method may be used to form the electron transfer layer 141, the luminous layer 142 and the positive hole transfer layer 143.

The supercritical drying method can be also used to form the polymer layer 3, the electron transfer layer 141, the luminous layer 142 and the positive hole transfer layer 143 in the passive matrix type organic electroluminescence display, and impurities are sufficiently removed by supercritical drying to enable the element to be prevented from being deteriorated.

Seal layers or synthetic resin layers may be provided at the side faces of each layer (film) in each embodiment described above.

While the organic electroluminescence display was described in the foregoing embodiments as one example of electro-optical device, the manufacturing method according to the present invention may be applied to manufacture the liquid crystal display and plasma display.

[Electronic Appliances]

Figure 19:
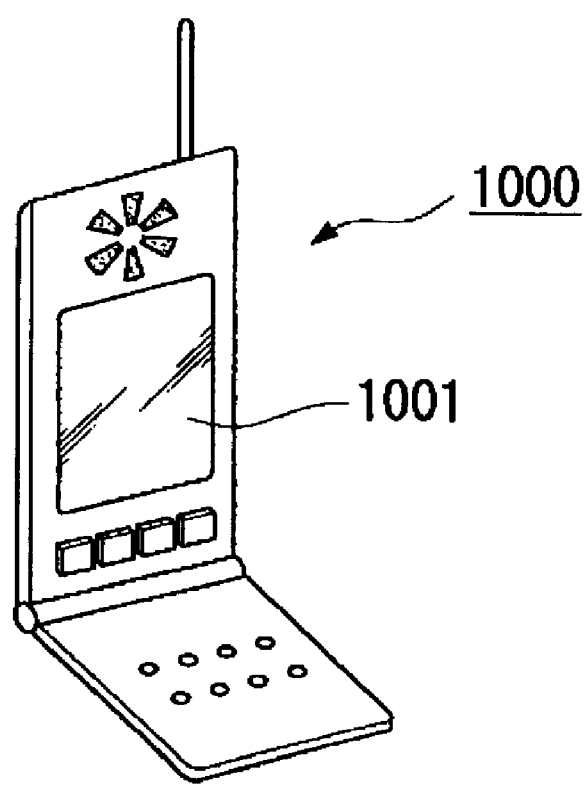
FIG. 19 is a perspective view that shows an example of an electronic appliance including the electro-optical device according to the present invention.

Electronic appliances provided with the organic electroluminescence display in the foregoing embodiments are described hereinafter. FIG. 19 is a perspective view of an example of a cellular phone. In FIG. 19, the reference numeral 1000 denotes the cellular phone unit, and the reference numeral 1001 denotes the display using the organic electroluminescence display.

Figure 20:
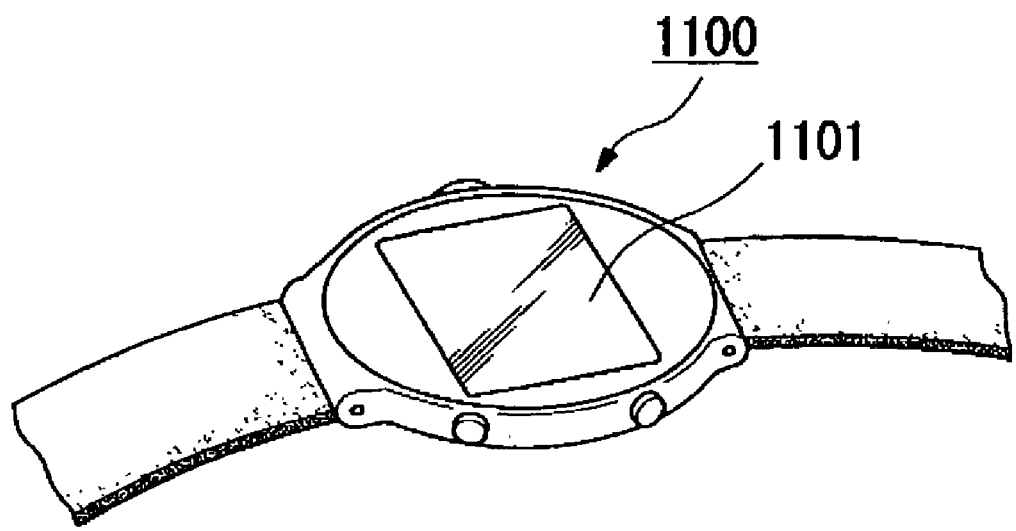
FIG. 20 is a perspective view that shows another example of the electronic appliance including the electro-optical device according to the present invention.

FIG. 20 is a perspective of an example of a watch type electronic apparatus. In FIG. 20, the reference numeral 1100 denotes the watch unit, and the reference numeral 1101 denotes the display using the organic electroluminescence display.

Figure 21:
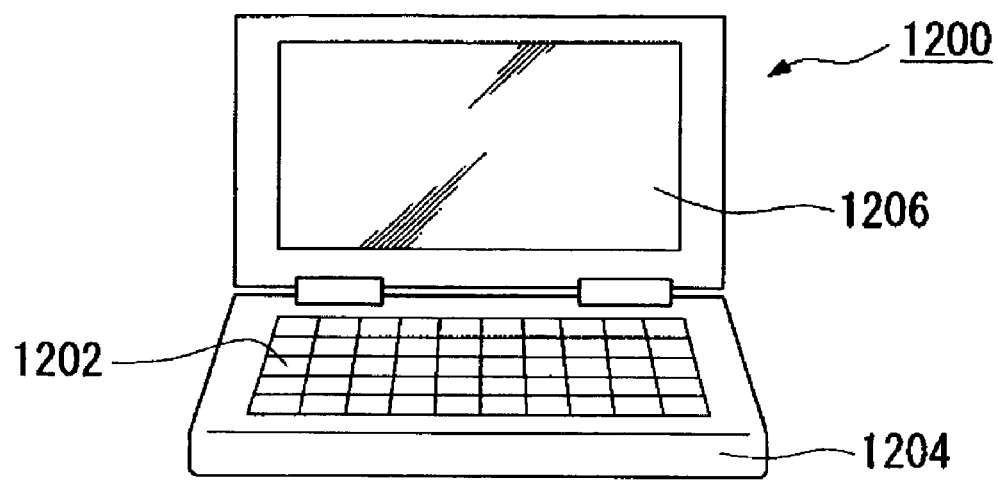
FIG. 21 is a perspective view that shows another example of an electronic appliance including the electro-optical device according to the present invention.
Figure 22:
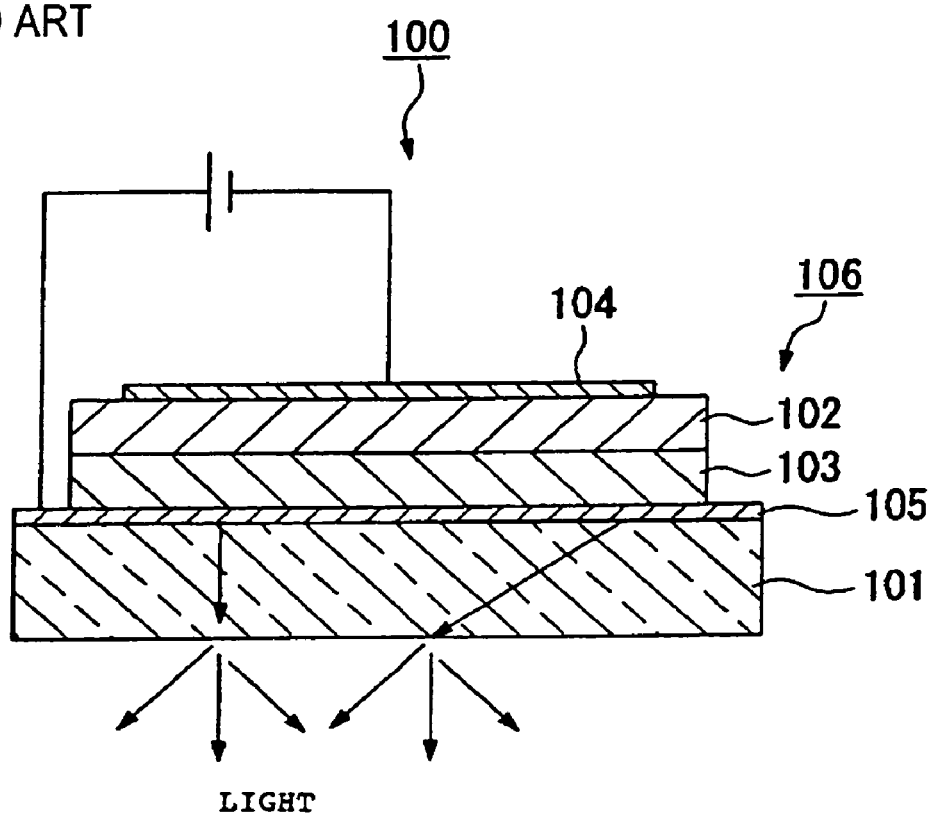
FIG. 22 is a schematic cross-sectional view of an example of a related art electro-optical device.

FIG. 21 is a perspective view showing an example of a portable type information processor, such as a word processor, and personal computer, for example. In FIG. 21, the reference numeral 1200 denotes the information processor, the reference numeral 1202 denotes an input device such as a keyboard, the reference numeral 1204 denotes the information processor unit, and the reference numeral 1206 denotes the display using the organic electroluminescence display.

Since the electronic appliances shown in FIGS. 19 to 21 provided with the organic electroluminescence display in the embodiments as described above can afford a bright display panel with high image quality.

The technical scope of the present invention is not restricted to the foregoing embodiments, and various modifications are possible within the scope not departing from the spirit of the present invention. The materials and layer structures as set forth in the embodiments are only examples, and appropriate modifications are possible.

[Advantages]

According to the present invention, solvents can be removed from the layers while maintaining chemical properties and physical properties of each layer in the laminated layer, by forming at least a part of the laminated layers under a supercritical condition above the critical points of the solvents (impurities) contained in the layers. Accordingly, optical characteristics of the electro-optical device can be maintained in good conditions for a long period of time.

What is claimed is:

1. A method for manufacturing a multiple-layer structure having a plurality of layers including a first layer, a second layer, and a third layer, the method comprising:
    forming the first layer on the second layer; and
    forming the third layer on the first layer, the third layer being an insulating layer,
    at least a part of the forming the first layer being performed under a supercritical condition,
    at least a part of the third layer contacting at least a part of the first layer, and
    the first layer being disposed between the second layer and the third layer.

2. The method according to claim 1, a refractive index of the first layer being lower than a refractive index of the second layer.

3. A method for manufacturing a multi-layer structure having a plurality of layers, comprising:
    forming at least two layers of the multi-layer structure,
    at least a part of the forming of the at least two layers being under a supercritical condition,
    at least one layer of the at least two layers including an organic polymer.

4. The method according to claim 3, the forming of the at least one layer that includes the organic polymer including
    disposing at least one type of a precursor of the organic polymer, and
    at least one of curing and polymerizing of the precursor.

5. The method according to claim 1, at least one layer of the plurality of layers being a barrier layer.

6. The method according to claim 5, the barrier layer including at least one of silicon nitride, silicon oxide nitride and silicon oxide.

7. The method according to claim 1,
    at least a part of the second layer contacting at least a part of the first layer.

8. An electro-optical device, comprising:
    a plurality of layers formed by the method according to claim 1.

9. A method for manufacturing an electro-optical device including a plurality of layers including a first layer, a second layer contacting the first layer, and a third layer, the method comprising:
    forming the first layer at least a part of the forming of the first layer being performed under a supercritical condition; and
    forming the second layer contacting the first layer, the first layer being an insulating layer, and
    the first layer being disposed between the second layer and the third layer.

10. The method according to claim 9,
    the first layer having a refractive index lower than a refractive index of the third layer.

11. A method for manufacturing an electro-optical device including a plurality of layers including an electro-optical layer including an organic electroluminescent material, the method comprising:
    forming the plurality of layers,
    at least a part of the forming of the plurality of layers being performed under a supercritical condition.

12. The method according to claim 9, further including forming a barrier layer.

13. A method for manufacturing an electro-optical device including an electro-optical element that is disposed between two electrodes, the method comprising:
    forming a film that is disposed between the two electrodes;
    at least a part of a formation of the film being performed under a supercritical condition.

14. The method according to claim 13,
    the electro-optical element being an organic electroluminescence element, and
    the film functioning as one of a luminous layer, an electron transport layer, an electron injection layer, a hole transport layer and a hole injection layer.

15. The method according to claim 13,
the film containing a polymer.

16. The method according to claim 13, further including forming a barrier layer.

17. An electronic appliance, comprising:
an electro-optical device according to claim 8.

18. An electronic appliance, comprising:
an electro-optical device manufactured by the method for manufacturing an electro-optical device according to claim 9.

19. An electronic appliance, comprising:
an electro-optical device manufactured according to claim the method of claim 13.

20. The method according to claim 1,
the first layer being a low refractive index layer having a refractive index lower than a refractive index of the second layer.

21. The method according to claim 12,
the barrier layer suppressing penetration of chemical species.

22. The method according to claim 1,
the second layer being a substrate,
the first layer having a refractive index lower than a refractive index of the substrate.

23. The method according to claim 9,
the first layer being a low refractive index layer having a refractive index lower than a refractive index of the second layer.

24. The method according to claim 9,
the plurality of layers further including an electro-optical element layer that emits a light, the light transmitting the first layer and the second layer.

25. The method according to claim 24,
the light being projected out from the third layer.

26. The method according to claim 24,
the plurality of layers including a barrier layer.

27. The method according to claim 26,
the barrier layer including at least one of silicon nitride, silicon oxide nitride and silicon oxide.

28. The method according to claim 13,
a current flowing between the two electrodes through the film.

29. The method according to claim 13,
the electro-optical element further including a plurality of films between the two electrodes.

* * * * *